US010217522B2

United States Patent
Wang et al.

(10) Patent No.: US 10,217,522 B2
(45) Date of Patent: Feb. 26, 2019

(54) FAST MAGNETOELECTRIC DEVICE BASED ON CURRENT-DRIVEN DOMAIN WALL PROPAGATION

(71) Applicant: Regents of the University of Minnesota, Minneapolis, MN (US)

(72) Inventors: Jian-Ping Wang, Shoreview, MN (US); Mahdi Jamali, Folsom, CA (US); Sachin S. Sapatnekar, St. Louis Park, MN (US); Meghna G. Mankalale, Minneapolis, MN (US); Zhaoxin Liang, Minneapolis, MN (US); Angeline Klemm Smith, Hillsboro, OR (US); Mahendra DC, Saint Paul, MN (US); Hyung-il Kim, Woodbury, MN (US); Zhengyang Zhao, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 15/600,958

(22) Filed: May 22, 2017

(65) Prior Publication Data

US 2017/0337983 A1 Nov. 23, 2017

Related U.S. Application Data

(60) Provisional application No. 62/340,262, filed on May 23, 2016.

(51) Int. Cl.
G11C 19/08 (2006.01)
G11C 19/00 (2006.01)
(Continued)

(52) U.S. Cl.
CPC .......... *G11C 19/0841* (2013.01); *B82Y 10/00* (2013.01); *G11C 11/161* (2013.01);
(Continued)

(58) Field of Classification Search
CPC ...................................... G11C 11/161
(Continued)

(56) References Cited

U.S. PATENT DOCUMENTS

2007/0138522 A1* 6/2007 Kijima ..................... G11C 11/22
257/295
2007/0247192 A1* 10/2007 Miyazaki ....... H03K 19/018521
326/83
(Continued)

OTHER PUBLICATIONS

H Schmid, Bull. Mater. Sci., vol. 17, No. 7, Dec. 1994, pp. 1411-1414.*
(Continued)

*Primary Examiner* — Min Huang
(74) *Attorney, Agent, or Firm* — Shumaker & Sieffert, P.A.

(57) ABSTRACT

In some examples, an electronic device comprising an input ferroelectric (FE) capacitor, an output FE capacitor, and a channel positioned beneath the input FE capacitor and positioned beneath the output FE capacitor. In some examples, the channel is configured to carry a magnetic signal from the input FE capacitor to the output FE capacitor to cause a voltage change at the output FE capacitor. In some examples, the electronic device further comprises a transistor-based drive circuit electrically connected to an output node of the output FE capacitor. In some examples, the transistor-based drive circuit is configured to deliver, based on the voltage change at the output FE capacitor, an output signal to an input node of a second device.

20 Claims, 20 Drawing Sheets

(51) Int. Cl.
  *G11C 11/22* (2006.01)
  *G11C 11/16* (2006.01)
  *H01L 43/08* (2006.01)
  *G11C 11/18* (2006.01)
  *B82Y 10/00* (2011.01)
  *H01L 29/66* (2006.01)
  *H01L 27/11521* (2017.01)
  *H01L 29/06* (2006.01)
  *H01L 27/118* (2006.01)

(52) U.S. Cl.
  CPC ......... *G11C 11/1675* (2013.01); *G11C 11/18* (2013.01); *G11C 11/221* (2013.01); *G11C 19/005* (2013.01); *H01L 27/11521* (2013.01); *H01L 29/0692* (2013.01); *H01L 29/66984* (2013.01); *H01L 43/08* (2013.01); *H01L 2027/11824* (2013.01)

(58) Field of Classification Search
  USPC ........................................ 365/145
  See application file for complete search history.

(56) References Cited

U.S. PATENT DOCUMENTS

| | | | |
|---|---|---|---|
| 2012/0176154 A1* | 7/2012 | Behin-Aein | H03K 19/16 326/37 |
| 2013/0314978 A1* | 11/2013 | Currivan | G11C 11/161 365/158 |
| 2014/0333362 A1* | 11/2014 | Zhu | G06F 1/3287 327/198 |
| 2015/0263258 A1* | 9/2015 | Kado | H01L 37/00 136/205 |
| 2015/0269478 A1* | 9/2015 | Datta | G06N 3/063 706/33 |
| 2015/0325278 A1* | 11/2015 | Bauer | H01L 43/08 365/158 |
| 2017/0069831 A1* | 3/2017 | Nikonov | H01L 43/08 |
| 2017/0243917 A1* | 8/2017 | Manipatruni | H01L 27/22 |
| 2017/0352702 A1* | 12/2017 | Braganca | H01L 43/08 |
| 2017/0352802 A1* | 12/2017 | Nikonov | H01L 43/08 |

OTHER PUBLICATIONS

Behin-Aein et al., "Proposal for an all-spin logic device with built-in memory," Nature Nanotechnology, vol. 5, Macmillan Publishers Limited, Feb. 28, 2010, 5 pp.
Chang et al., "Clocked Domain Wall Logic Using Magnetoelectric Effects," Journal of Exploratory Solid-State Computational Devices and Circuits, IEEE, Mar. 9, 2016, 9 pp.
Chauleau et al., "Magnetic domain walls displacement: Automation versus spin-transfer torque," Physical Review, The American Physical Society, Dec. 10, 2010, 7 pp.
Datta et al., "Non-volatile spin switch for Boolean and non-Boolean logic," American Institute of Physics, Dec. 20, 2012, 6 pp.
Donahue et al., "OOMMF User's Guide," Release 1.0, NIST Publications, Sep. 14, 1999, 87 pp.
Emori et al., "Current-driven dynamics for chiral ferromagnetic domain walls," Nature Materials, vol. 12, Macmillan Publishers Limited, Jun. 16, 2013, 6 pp.
Fiebig, "Revival of the magnetoelectric effect," Institute of Physics Publishing, Journal of Physics D: Applied Physics, Feb. 1, 2005, 30 pp.
Kumar et al., "Electromigration stress induced deformation mechanisms in free-standing platinum thin films," Scripta Materialia, Elsevier, Apr. 28, 2011, 4 pp.
Mankalale et al., "A Fast Magnetoelectric Device Based on Current-driven Domain Wall Propagation," Jun. 19, 2016, 2 pp.
Mankalale et al., CoMET: Composite-Input Magnetoelectric-based Logic Technology, Journal of Exploratory SOlid-State Computations Devices and Circuits, vol. 3, IEEE, Apr. 6, 2017, 8 pp.
Nikonov et al., "Proposal of a Spin Torque Majority Gate Logic," Electron Device Letters, vol. 32, No. 8, IEEE, Aug. 2011, 3 pp.
Sugihara et al., "High Perpendicular Magnetic Anisotropy in D022-Mn3+xGe Tetragonal Huesler alloy," American Institute of Physics, AIP Publishing LLC, Apr. 2, 2014, 5 pp.
Thomas et al., "Resonant Amplification of Magnetic Domain-Wall Motion by a Train of Current Pulses," Science, vol. 315, Mar. 16, 2007, 5 pp.
Yang et al., "Domain-wall velocities of up to 750 m s-1 driven by exchange-coupling torque in synthetic antiferromagnets," Focus, Nature Nanotechnology, vol. 10, Feb. 23, 2015, 6 pp.
Zha et al., "Nanostructured MnGa films on Si/SiO2 with 20.5 kOe room temperature coercivity," Journal of Applied Physics, Nov. 1, 2011, 5 pp.

* cited by examiner

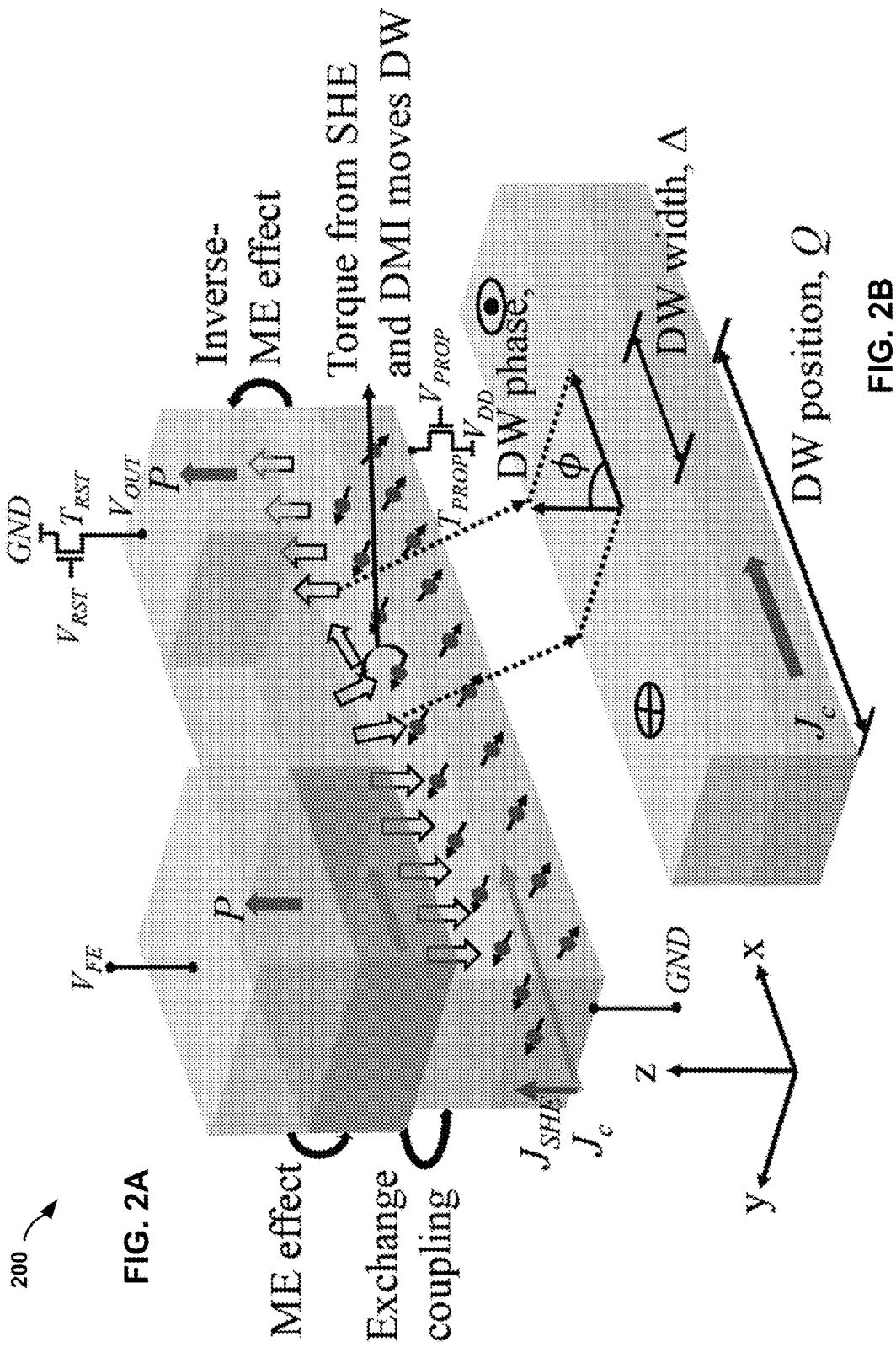

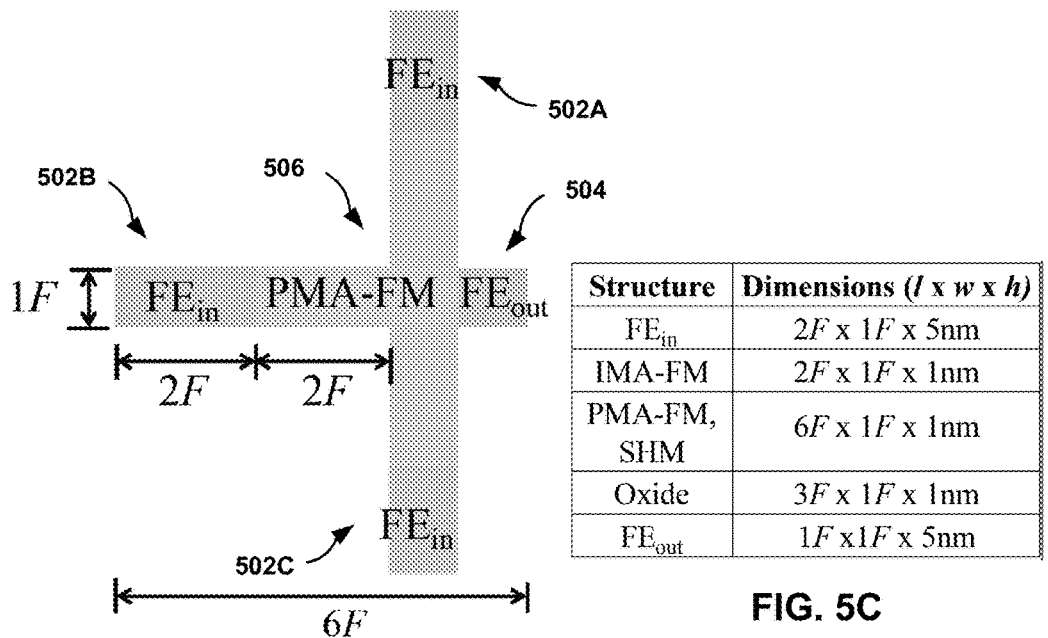
FIG. 5B
FIG. 5C
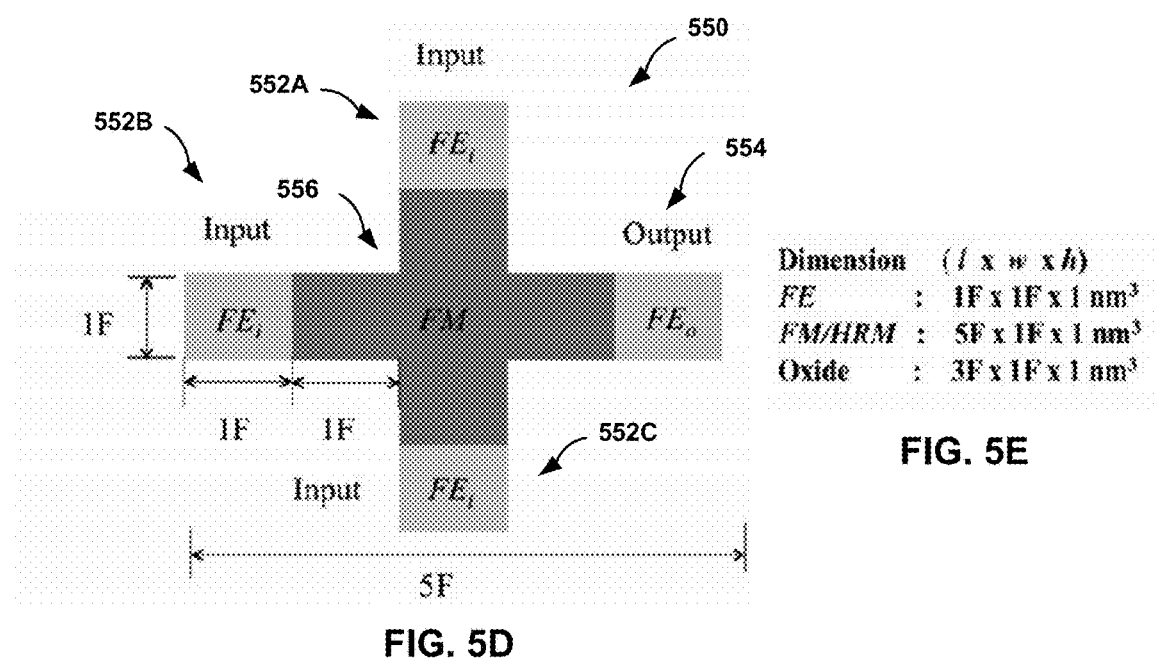
FIG. 5D
FIG. 5E

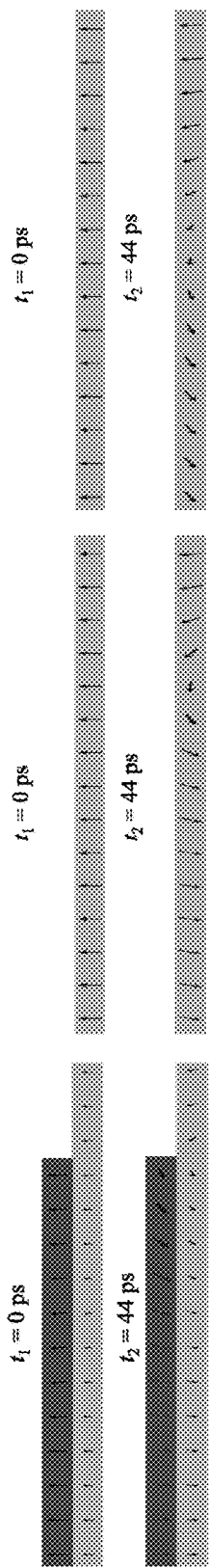
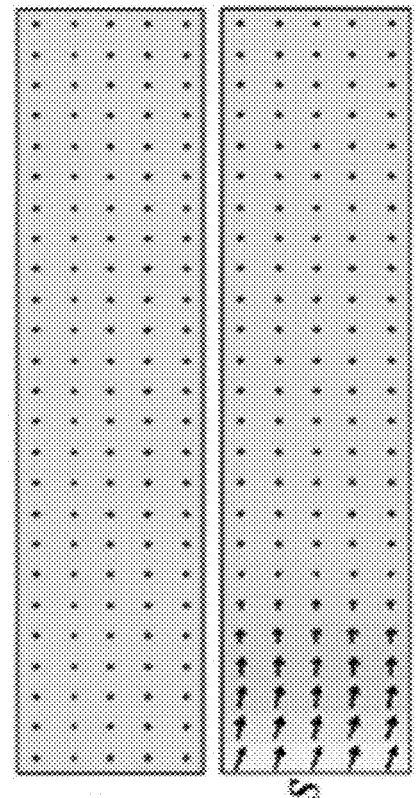
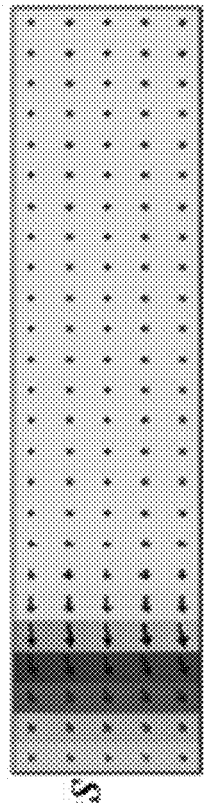
FIG. 7A    FIG. 7B    FIG. 7C    FIG. 7D

| $V_{FE}$ (mV) | $t_{nucleate}$ (ps) | $t_{propagate}$ (ps) | $t_{qtransfer}$ (ps) | $T_{CoMET}$ (ps) |
|---|---|---|---|---|
| 110 | 30/30 | 36.2/18.1 | 7.9/7.9 | 148.2/112.0 |
| 150 | 25/25 | 36.2/18.1 | 6.2/6.2 | 134.8/98.6 |

| $V_{FE}$ (mV) | $E_{FE}$ (aJ) | $E_{TX}$ (aJ) | $E_{Joule}$ (aJ) | $E_{leakage}$ (aJ) | $E_{CoMET}$ (aJ) |
|---|---|---|---|---|---|
| 110 | 0.5/0.1 | 16.8/12.0 | 1.8/0.1 | 13.7/13.7 | 65.6/51.8 |
| 150 | 0.9/0.3 | 21.4/15.3 | 1.8/0.1 | 18.5/18.5 | 85.2/68.4 |

FIG. 12A

| $V_{FE}$ (mV) | $t_{nucleate}$ (ps) | $t_{propagate}$ (ps) | $t_{qtransfer}$ (ps) | $T_{CoMET}$ (ps) |
|---|---|---|---|---|
| 110 | 35/35 | 77.4/38.7 | 8.8/8.8 | 242.4/165.5 |
| 150 | 30/30 | 77.4/38.7 | 8.2/8.2 | 231.2/153.8 |

| $V_{FE}$ (mV) | $E_{FE}$ (aJ) | $E_{TX}$ (aJ) | $E_{Joule}$ (aJ) | $E_{leakage}$ (aJ) | $E_{CoMET}$ (aJ) |
|---|---|---|---|---|---|
| 110 | 2.4/0.8 | 40.8/24.2 | 19.8/1.6 | 16.3/16.3 | 158.6/85.8 |
| 150 | 4.4/1.5 | 42.0/30.6 | 25.5/1.5 | 22.8/22.8 | 189.4/112.8 |

FAST MAGNETOELECTRIC DEVICE BASED ON CURRENT-DRIVEN DOMAIN WALL PROPAGATION

This application claims the benefit of U.S. Provisional Patent Application No. 62/340,262, filed May 23, 2016, the entire content of which being incorporated herein by reference.

GOVERNMENT INTEREST

This invention was made with government support under Grant No. HR0011-13-3-0002 awarded by the Department of Defense/Defense Advanced Research Projects Agency (DARPA). The government has certain rights in the invention.

TECHNICAL FIELD

This disclosure relates to magnetoelectric based logic devices.

BACKGROUND

The scaling of conventional semiconductor devices may be limited by factors including device reliability and increased power consumption. Improvement in the performance of memory and computational devices is continuously pursued. Spin-based or spintronic devices may be used as alternatives to or in conjunction with electronic devices. Spin-based effects may be used by devices such as spintronic devices that harness the intrinsic spin of electrons and their associated magnetic moments, in addition to electronic phenomena that arise from the fundamental electronic charges of electrons.

SUMMARY

This disclosure describes techniques related to fast, low-power spintronics-based circuits. An example spintronics-based circuit device may include an input ferroelectric (FE) capacitor and an output FE capacitor that are each magnetically coupled to a ferromagnetic (FM) channel. The FM channel may be configured to carry a magnetic signal from the input FE capacitor to the output FE capacitor, which causes a change in voltage at the output FE capacitor. In this way, the example device transmits a voltage from an input to an output. In some examples, the device may also include a transistor-based drive circuit that is electrically connected to the output node of the output FE capacitor to drive a second circuit device. By coupling input FE capacitors and output FE capacitors using the example techniques, complex logic circuits can be formed.

In some examples, an electronic device includes an input FE capacitor, an output FE capacitor, and a channel positioned beneath the input FE capacitor and positioned beneath the output FE capacitor, wherein the channel is configured to carry a magnetic signal from the input FE capacitor to the output FE capacitor to cause a voltage change at the output FE capacitor. In some examples, the electronic device also includes a transistor-based drive circuit electrically connected to an output node of the output FE capacitor, wherein the transistor-based drive circuit is configured to deliver, based on the voltage change at the output FE capacitor, an output signal to an input node of a second device.

In some examples, an electronic device includes an input FE capacitor, an output FE capacitor, and an FM channel positioned beneath the input FE capacitor and positioned beneath the output FE capacitor. In some examples, a magnetization state of the FM channel is configured to change in response to a voltage applied across the input FE capacitor. In some examples, a change in the magnetization state of the FM channel causes a voltage change at the output FE capacitor. In some examples, the electronic device further includes an FM material with in-plane magnetic anisotropy (IMA-FM material), wherein the IMA-FM material is positioned between the input FE capacitor and the FM channel.

In some examples, a method for manufacturing an electronic device includes forming an FM channel and forming an FM material with in-plane magnetic anisotropy (IMA-FM material) positioned above the FM channel. In some examples, the method also includes forming an input FE capacitor positioned above the IMA-FM material and forming an output FE capacitor positioned above the FM channel. In some examples, the method further includes forming an oxide layer positioned above the FM channel and positioned between the input FE capacitor and the output FE capacitor.

In some examples, an electronic device includes an input FE capacitor, an output FE capacitor, and an FM channel positioned beneath the input FE capacitor and positioned beneath the output FE capacitor. In some examples, a magnetization state of the FM channel is configured to change in response to a voltage applied across the input FE capacitor. In some examples, a change in the magnetization state of the FM channel causes a voltage change at the output FE capacitor. In some examples, the electronic device further includes layer of high-resistivity material (HRM) positioned beneath the FM channel and a switch electrically connected to the HRM proximate the output FE capacitor or proximate the input FE capacitor, wherein the HRM is configured to carry an electrical current when the switch is closed, and wherein the electrical current is configured to facilitate the change in the magnetization state of the FM channel.

In some examples, an electronic device includes a FM channel and an IMA-FM material positioned above the FM channel. In some examples, the electronic device further includes an input FE capacitor, where the IMA-FM material is positioned between the input FE capacitor and the FM channel, and an output FE capacitor positioned above the FM channel.

The details of one or more examples are set forth in the accompanying drawings and the description below. Other features, objects, and advantages will be apparent from the description and drawings, and from the claims.

BRIEF DESCRIPTION OF DRAWINGS

FIGS. 2A and 2B are perspective diagrams illustrating underlying physical mechanisms of an example device of FIG. 1, including the position, width, and phase of the domain wall (DW), in accordance with some examples of this disclosure.

FIG. 5B illustrates the structure of another example three-input majority gate device, in accordance with some examples of this disclosure.

FIG. 5C is a table providing example dimensions of the example three-input majority gate device of FIG. 5B.

FIG. 5D illustrates the structure of another example three-input majority gate device, in accordance with some examples of this disclosure.

FIG. 5E is a table providing example dimensions of the example three-input majority gate device of FIG. 5D.

FIGS. 7A-7D illustrate the nucleation of a DW in PMA-FM material, in accordance with some examples of this disclosure.

FIGS. 12A and 12B are tables illustrating delay and energy of a majority gate device, in accordance with some examples of this disclosure.

DETAILED DESCRIPTION

Figure 1:
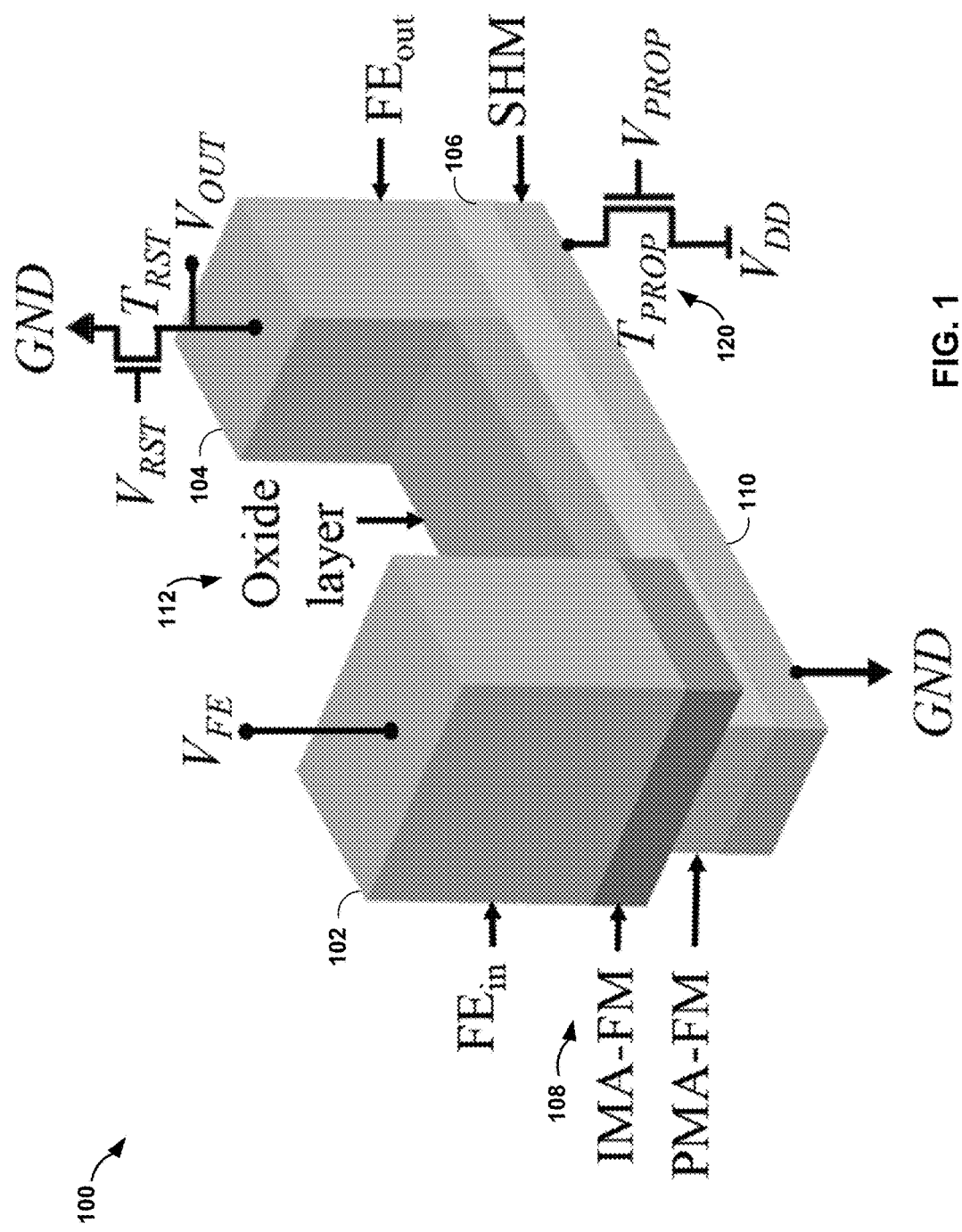
FIG. 1 is a perspective diagram illustrating a device including the composite structure of in-plane magnetic anisotropy FM (IMA-FM) material exchange-coupled with perpendicular magnetic anisotropy ferromagnetic (PMA-FM) channel at the input end of the device, in accordance with some examples of this disclosure.

In general, a logic device may be configured to generate an output signal based on one or more input signal. In the example of a field-effect transistor (FET), the electrical current flowing between the drain terminal and the source terminal (i.e., the output signal) may be based on the relative voltages at the drain, source, and gate terminals of the FET. This disclosure describes an electronic device that may operate as a logic device and may be an alternative to a FET.

An example electronic device of this disclosure includes an input node including an input ferroelectric (FE) capacitor and an output node including an output FE capacitor. An input signal received by the input FE capacitor may cause a magnetic signal to pass through a ferromagnetic (FM) channel that extends between the input FE capacitor and the output FE capacitor. The magnetic signal may result from an effect known as Spin-Transfer Torque (STT) in the FM channel.

The input signal may be a voltage signal that causes a change in the magnetization state of a portion of the FM channel that is adjacent to the input FE capacitor. The input signal may cause the change in magnetization state of the portion of the FM channel through the magnetoelectric (ME) effect. In some examples, to facilitate the change in magnetization state, the electronic device may include an FM material with in-plane magnetic anisotropy (IMA) positioned between the input FE capacitor and the FM channel. The IMA-FM material may allow the electronic device to operate on relatively low voltages in the range of one hundred and ten millivolts. Consequently, the electronic device may also have relatively low power consumption.

For instance, this disclosure describes an electronic device called "CoMET," a fast and energy-efficient spintronics device for logic applications. As described above, an input voltage is applied to an FE material, in contact with a composite structure—an FM material with in-plane magnetic anisotropy (IMA) placed on top of an intra-gate FM interconnect with perpendicular magnetic anisotropy (PMA). Through the ME effect, the input voltage nucleates a DW at the input end of the PMA-FM interconnect. An applied current then rapidly propagates the DW towards the output FE structure, where the inverse-ME effect generates an output voltage. This voltage is propagated to the input of the next COMET device using a novel circuit structure that enables efficient device cascading. The material parameters for COMET are optimized by systematically exploring the impact of parameter choices on device performance.

In some examples, the electronic device may also include a layer of high-resistivity material (HRM) positioned near the FM channel to facilitate the flow of the magnetic signal through the FM channel. A voltage signal delivered to the HRM may affect whether and/or how quickly the magnetic signal travels through the FM channel from the input FE capacitor to the output FE capacitor. As a result, the electronic device may operate as a three-terminal device such as a switch, with each FE capacitor and the HRM functioning as a terminal.

When the magnetic signal reaches a portion of the FM channel that is adjacent to the output FE capacitor, the magnetic signal may cause a voltage change in the output FE capacitor through the inverse-ME effect. In some examples, the electronic device may also include an output circuit electrically connected to an output node of the output FE capacitor. The output circuit may include a transistor-based drive circuit configured to deliver an output signal to a second device, such as an electronic device of this disclosure or a transistor-based device. The transistor-based drive circuit may reduce or remove the need for scaling of electronic devices that are connected in series. In some examples, other systems may have a ratio of six to one for two electronic devices connected in series. In some examples, the output circuit of this disclosure may allow for one-to-one ratios between electronic devices connected in series.

As described in more detail, the example electronic device described in this disclosure may provide advantages. Such advantages should not be considered as limiting or necessary in all cases. Several emerging spintronic devices may perform computation by (a) generating spin currents based on input magnet states to switch an output magnet state using STT, (b) using multiple nanopillars to drive a domain wall (DW) of a magnetic signal that switches an output nanopillar using STT, and/or (c) using ME switching at the input, combined with DW automotion, to switch an output state. All of these devices may have delays of several nanoseconds. The energy for (a) and (b) tends to be in the range of femtoJoules (fJ), while the ME mechanism in (c) facilitates greater energy-efficiency, in the attoJoules (aJ) range. Some of these types of spintronic devices (e.g., unlike those described in this disclosure) may not provide delays and/or energy consumption similar to complementary metal-oxide-semiconductor (CMOS) devices, where gate delays and switching energies are in the range of picoseconds (ps) and attoJoules (aJ), respectively.

This disclosure describes a device that uses ME coupling with current-driven DW propagation to ensure energy dissipation in the range of aJ. In addition, the device, as described in this disclosure, may provide delay in the approximate range of traditional transistors. This disclosure describes material parameter values for better delay and energy, and provides example results. In some examples, an electronic device of this disclosure may achieve or exceed CMOS-comparable performance. As an example, simulations on a 7 nm (nanometer) COMET device show fast, low-energy operation, with a delay/energy of 99 ps/68 aJ for a COMET inverter (INV) and 135 ps/85 aJ for a three-input COMET majority gate (MAJ3).

FIG. 1 is a perspective diagram illustrating a device 100 including the composite structure of in-plane magnetic anisotropy FM (IMA-FM) material 108 exchange-coupled with perpendicular magnetic anisotropy ferromagnetic (PMA-FM) channel 106 (i.e., PMA-FM interconnect) at the input end of device 100, in accordance with some examples of this disclosure. At the input, a FE capacitor 102, $FE_{in}$, is placed atop IMA-FM 108. IMA-FM 108 is exchange-coupled with the input end of a longer PMA-FM interconnect 106. The IMA-FM material 108 may be positioned between the input FE capacitor 102 and the PMA-FM channel 106 to prevent the flow of electricity between the input FE capacitor 102 and the PMA-FM channel 106. The IMA-FM material 108 may be configured to speed up the formation of a DW in the FM channel 106.

At its output end, a second FE capacitor 104, $FE_{out}$, is placed on top of the PMA-FM interconnect 106. A layer of high-resistivity spin-Hall material (SHM) 110, which is conducive to strong spin-orbit interaction, is placed beneath PMA-FM channel 106. SHM 110 may include platinum, tungsten, tantalum, an alloy or a multilayer of platinum, tungsten, or tantalum, or a topological insulator, such as $Bi_2Se_3$, $Bi_2Te_3$, $Sb_2Se_3$, and $Sb_2Te_3$. Oxide layer 112 is present on top of PMA-FM 106 between $FE_{in}$ 102 and $FE_{out}$ 104. Oxide layer 112 may be configured to prevent the flow of electricity directly between the input FE capacitor and the output FE capacitor 104.

FIG. 1 is a perspective diagram illustrating device 100 including two FE capacitors 102 and 104 and FM channel 106, in accordance with some examples of this disclosure. FIG. 1 shows just one example of a proposed device. Electronic device 100 comprises FE capacitor 102 at the input and FE capacitor 104 at the output with an FM interconnect (i.e., an FM channel 106) in between. A layer of HRM 110 is present beneath FM channel 106. Oxide layer 112 covers FM channel 106 between input and output FE capacitors 102 and 104. The different underlying physical mechanisms at the interface or within the structure include DW interconnect for the overall structure of electronic device 100, ME coupling for input FE capacitor 102, STT, Spin-Hall Effect (SHE), and Dzyaloshinskii-Moriya Interaction (DMI) for the DW interconnect (i.e., FM channel 106), and inverse ME coupling for output FE capacitor 104.

FIG. 1 illustrates one example structure of device 100, but it should be understood that not all layers are needed in all examples. For example, an electronic device, like device 100, may include first FE capacitor 102 (e.g., an input FE capacitor), and second FE capacitor 104 (e.g., an output FE capacitor). In addition, the device may include FM channel 106. This example device may further include the other materials such as the IMA-FM material, PMA-FM material, layer of HRM 110, and oxide layer 112, but need not include all of these materials (e.g. may only include oxide layer 112)

FM channel 106 may be initially at a particular magnetization state (e.g., first magnetization state corresponding to a first magnetization direction, or a second magnetization state corresponding to a second magnetization direction). However, the magnetization state of the FM channel 106 may change in response to a voltage applied across first FE capacitor 102, and this change in magnetization state of the FM channel causes a voltage change at second FE capacitor 104. In this way, a voltage applied to first FE capacitor 102 affects the voltage at second FE capacitor 104.

By selectively applying voltages at first FE capacitor 102, it may be possible to set the voltage at the second FE capacitor 104. Accordingly, device 100 may operate similar to a logic device, where an input voltage (e.g., voltage at first FE capacitor 102) sets an output voltage (e.g., voltage at second FE capacitor 104). In addition, as described in more detail, device 100 may provide delay and energy consumption properties that are approximately better than or equal to those available from CMOS transistors.

There may have been attempts to use spin-based devices rather than transistors. For example, several spin-based devices have been proposed as alternatives to CMOS, leveraging STT, switching an FM channel by transferring electron angular momentum to the magnetic moment; spin-Hall effect (SHE), generating spin current from a charge current through a high resistivity material; ME effect, using an electric field to change FM magnetization; DW motion through an FM using automotion, an external field or current; dipole coupling between the magnets; and propagating spin wave through an FM.

However, in order for spin-based devices such as a spin-based processor to be running at a CMOS-competitive clock speed of 1 GHz, the device delay should be around 100 ps. Theoretically, some of these other proposed devices can achieve this target delay at the cost of additional energy. However, in order to be competitive with CMOS, spin-based device not only has to be fast, but also energy efficient, i.e., its energy dissipation should be in the range of a few hundred aJ.

Device 100 is an example of a composite-input magnetoelectric based device (COMET) that nucleates a domain wall (DW) in an FM channel 106 with perpendicular magnetic anisotropy (PMA), and uses current-driven DW motion to propagate the signal to the output (e.g., from first FE capacitor 102 to second FE capacitor 104). A voltage applied on an input FE capacitor 102 nucleates the DW through the ME effect. The DW may be a leading or trailing edge of a signal, where the signal includes a magnetization state (i.e., magnetization direction) of the portions of the FM channel 106. For fast, energy-efficient nucleation, the device 100 may include a composite structure with an IMA-FM layer above the PMA-FM channel. The DW is propagated to the output end of the PMA channel using a charge current applied to a layer of high resistivity material placed under the PMA channel. The inverse-ME (IME) effect induces a voltage at the output end (e.g., at output FE capacitor 104), and, as described in more detail, a circuit structure may transmit the signal to the next stage of logic.

In some cases, the composite structure of IMA-FM/PMA-FM allows DW nucleation under a low applied voltage of 110 mV. Accordingly, device 100 may output a voltage at second FE capacitor 104 based on an input voltage at input FE capacitor using low applied voltage (e.g., 110 mV, whereas CMOS devices may use 500 mV to a 1V). Before the application of a voltage, the magnetization in the PMA-FM is moved away from its easy axis by the strong exchange coupling between IMA-FM/PMA-FM, thus enabling a fast low-power DW nucleation, which may mean that there is low delay (e.g., the voltage at second capacitor 104 changes relatively quickly in response to application of an input voltage at first capacitor 102). For instance, the amount of time it takes for the output voltage at second capacitor 104 to change based on the voltage at first capacitor 102 may be a function of the rate at which the domain wall (DW) propagates through FM channel 106 (e.g., DW nucleation in FM channel 106). Hence, in the example device 100, because the DW nucleation is relatively fast, the delay of device 100 may be relatively low. In some examples, an exchange-coupling control interlayer may be positioned between the IMA-FM material and the PMA-FM channel. Charge current results in fast DW propagation through the PMA-FM interconnect.

The current-driven DW motion scheme has been experimentally shown to be fast, with velocities up to 750 m/s. A PMA channel is used for DW motion, as against one with in-plane magnetic anisotropy (IMA), since it may be more robust to DW pinning and surface roughness effects.

Figure 4A:
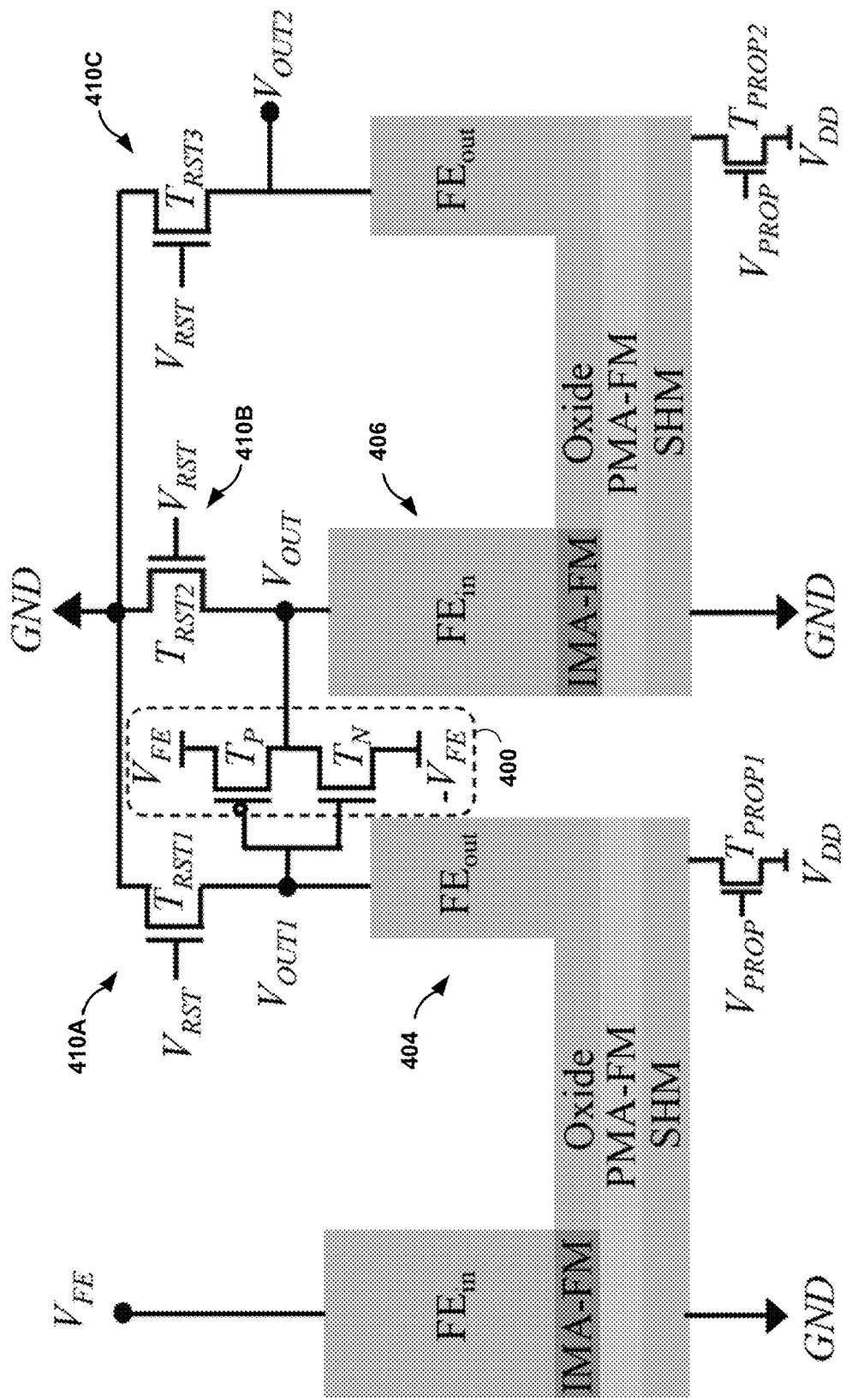
FIG. 4A is a side-view diagram illustrating the logic cascading of two electronic devices using two transistors.

As described in more detail, such as with FIG. 4A, an inverter may be coupled to the output FE capacitor. For example, a circuit structure comprising a dual-rail inverter allows efficient cascading of devices. This scheme improves upon a previous scheme of 6:1 device ratioing and the need for repeated amplifications (e.g., other techniques need to amplify or ratio may devices which uses addition power and space on a circuit). The 6:1 may refer to the size of a first electronic device to the size of a second electronic device connected in series. In such an example, the second device may be six times larger than the first device, and the third device may be thirty-six times larger than the first device, and so on. The design space of the possible PMA-FM material parameters optimizes the performance of the device. Through this systematic design space exploration, it is possible to achieve inverter delay/energy of 99 ps/68 aJ.

An electronic device (e.g., device 100) of this disclosure may operate on relatively low voltages on the order of one hundred millivolts. In contrast, a CMOS device may operate on voltages that are one or more volts. Therefore, the electronic device may have relatively low power supply, in some examples. The electronic device may not include scaling circuitry because the output signal may include the same scale as the input signal.

FIGS. 2A and 2B are perspective diagrams illustrating underlying physical mechanisms of an example device 100 of FIG. 1, including the position (Q), width (Δ), and phase (ϕ) of the domain wall (DW), in accordance with some examples of this disclosure. FIG. 2A depicts the DW as a change in magnetization state along the length of the FM channel. The width of the DW may be defined as the distance along which the magnetization state changes. Outside of the DW, the magnetization state of the FM channel may be constant as a function of distance in the x-axis direction. For example, in the FM channel on one side of the DW, the magnetization state may point in the positive z-axis direction, and in the FM channel on the other side of the DW, the magnetization state may point in the negative z-axis direction. The phase of the DW may be a function of the width of the DW in the x-axis direction and the thickness of the FM channel in the y-axis direction.

FIGS. 2A and 2B also depict the charge current ($J_c$) flowing through the HRM. The HRM may be configured to generate a SHE current ($J_{SHE}$) based on the charge current. The SHE current may cause the DW to propagate through the FM channel at a faster rate, as compared to the propagation of a DW in the absence of a SHE current. The spin-transfer torque from the SHE current may cause the DW to move through the FM channel. When the DW reaches the output FE capacitor, the DW may deliver a voltage signal ($V_{OUT}$) to the output FE capacitor through the inverse ME effect.

Figure 3A:
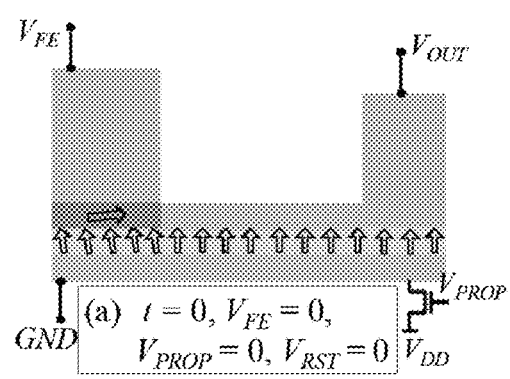
FIGS. 3A-3D are side-view diagrams illustrating the operation of the device of FIG. 1, in accordance with some examples of this disclosure.
Figure 3B:
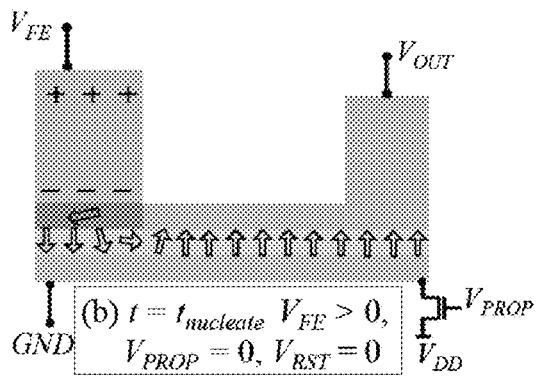
Figure 3C:
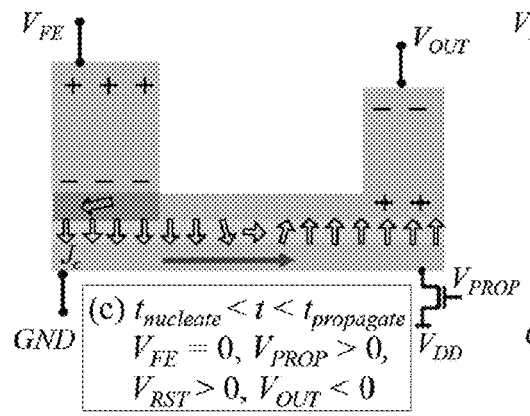
Figure 3D:
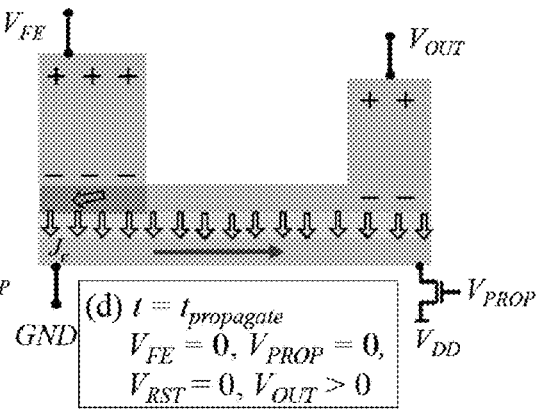

FIGS. 3A-3D are side-view diagrams illustrating the operation of an example device of FIG. 1, in accordance with some examples of this disclosure. FIG. 3A shows the steady state before $V_{FE}$ is applied (e.g., before input voltage is applied to first capacitor 102), and FIG. 3B shows the nucleation of the DW in PMA-FM (i.e., the FM channel) after $V_{FE}$ is turned on. FIG. 3C shows the propagation of the DW by turning on $V_{PROP}$, and charging of the output FE capacitor when $V_{RST}$>0 is applied, and FIG. 3D shows the induction of an output voltage $V_{OUT}$ through the inverse-ME effect.

As illustrated, the electronic device may include a switch, such as a transistor (i.e., $T_{PROP}$), that is electrically connected to the HRM (i.e., SHM) and to power supply circuitry (i.e., $V_{DD}$). In some examples, the switch may be proximate to the output end of the HRM. When the switch is closed, the output end of the HRM may have an electrical potential of VDD, causing an electrical current to flow through the HRM. The electrical current flowing through the HRM may facilitate the DW moving from the input end of the FM channel to the output end of the FM channel.

In FIG. 3A, at time t=0, an applied voltage, $V_{FE}$, charges $FE_{in}$. The resulting electric field across $FE_{in}$, $E_{FE}$, may be positive or negative, depending on the sign of $V_{FE}$, and generates an effective magnetic field, $H_{ME}$, through the ME effect that couples the electric polarization in $FE_{in}$ with the magnetization in the IMA-FM. This magnetic field acts on the composite structure. For $V_{FE}$>0, this nucleates a DW in the PMA-FM as seen from FIG. 3B, with a down-up configuration if the initial magnetization is along the +z axis. For the opposite case, an up-down configuration is nucleated.

Delivering the input voltage signal (i.e., $V_{FE}$) to the top node of the input FE capacitor ($FE_{in}$) may cause or induce a slip in the polarization of the PMA-FM layer. The slip in polarization may be a change in the magnetization state, the magnetization direction, and/or orientation of all or a portion of the FM channel (i.e., the PMA-FM layer). The input FE capacitor may be configured to induce through the IMA-FM material, a magnetic orientation in the FM channel in response to a voltage applied across the input FE capacitor (i.e., $V_{FE}$). The applied voltage may cause the magnetic orientation in the input end of the FM channel to flip or change, causing the formation of a DW between the PMA-FM material with the new magnetic orientation and the PMA-FM material with the original magnetic orientation.

If the initial orientation of the PMA-FM is at an angle to the z-axis, a smaller $H_{ME}$ field can nucleate the DW. The composite structure creates this angle due to strong exchange coupling between the IMA-FM and the PMA-FM as can be seen from the magnetization of PMA-FM in FIG. 3A, thus allowing nucleation under a low magnitude of $V_{FE}$. In the absence of IMA-FM, voltages up to 1V are necessary to nucleate a DW whereas, with the presence of IMA-FM, voltages as low as 110 mV would suffice. The IMA-FM may cause the magnetization state in the PMA-FM material to change more easily.

Once the DW is nucleated in PMA-FM, transistor $T_{PROP}$ is turned on using the signal $V_{PROP}$ to send a charge current ($J_c$) through the SHM. The PMA-FM channel may be configured to carry a signal, such as the new magnetization state or a change in magnetization state, from the input FE capacitor to the output FE capacitor. The signal may propagate through the FM channel by at least moving the DW from the input end of the FM channel to the output end of the FM channel. Due to SHE, electrons with opposite spin accumulate in the direction transverse to the charge current as shown in FIG. 2A. As a result, a spin current ($J_{SHE}$) is generated in a direction normal to the plane of SHM. The resultant torque from the combination of SHE and Dzyaloshinskii-Moriya interaction (DMI) at the interface of PMA-FM and the SHM propagates the DW to the output end. The transistor $T_{PROP}$ may be located at either the input end or the output end of the SHM to cause the charge current to travel through the SHM.

Before the DW reaches the output, $V_{RST}$ turns on transistor $T_{RST}$ to connect $FE_{out}$ to GND as seen from FIG. 3C. $T_{RST}$ is reset transistor electrically connected between the output node of $FE_{out}$ and a reference voltage source or sink, such as reference ground (GND). In some examples, a reset circuit (not shown) electrically connected to the output node of $FE_{out}$ may include any structure, such as $T_{RST}$, that can be used to reset the voltage at the output node of $FE_{out}$. This causes $FE_{out}$ to charge due to the presence of an electric field across it as a result of the IME effect. This step resets the capacitor such that once the DW reaches the output, it can either reverse or maintain the electric polarization of $FE_{out}$ (i.e., the output FE capacitor), thus reflecting the result of the operation.

The DW reaches the output end in time $t_{propagate}$ as seen from FIG. 3D and switches the magnetization of PMA-FM. The magnetization in PMA-FM couples with the electric polarization of $FE_{out}$ through the IME effect. As a result, a voltage, $V_{OUT}$, is induced at the output node.

Figure 4B:
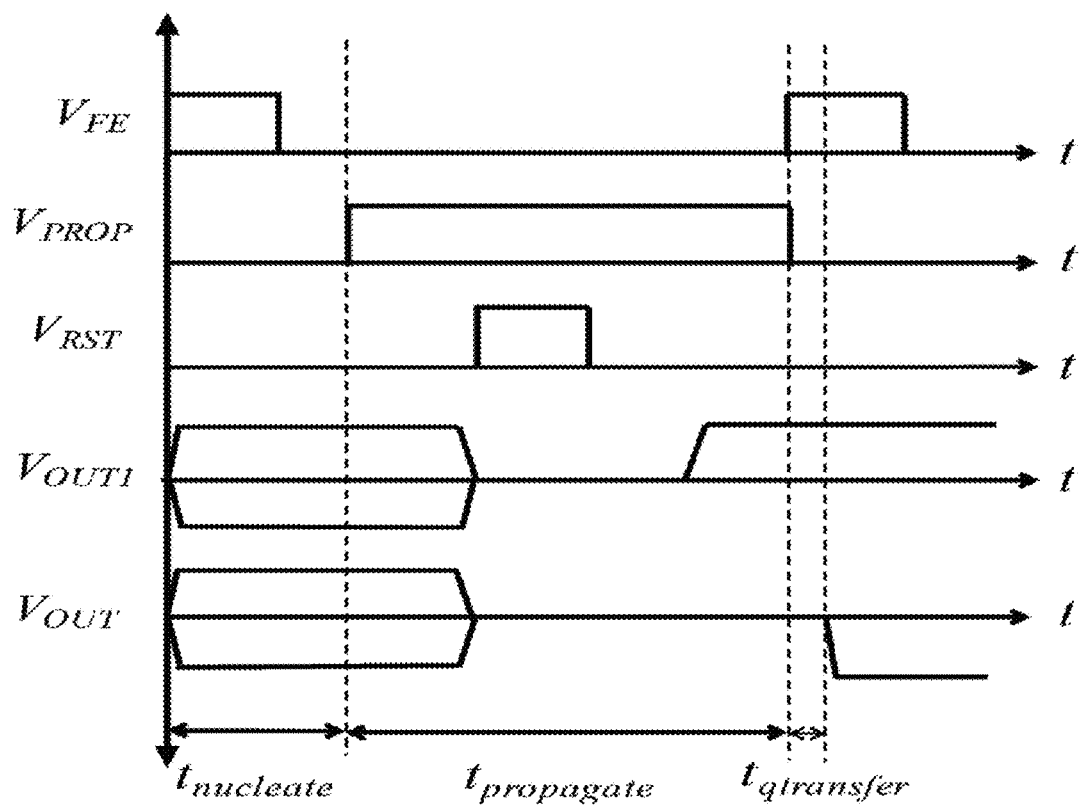
FIGS. 4B and 4C are timing diagrams illustrating the application of $V_{FE}$, $V_{PROP}$, and $V_{RST}$ signals to the devices of FIG. 4A, in accordance with some examples of this disclosure.

FIG. 4A is a side-view diagram illustrating the logic of transistor-based drive circuit 400 cascading of two electronic devices using two transistors. Successive logic stages of COMET can be cascaded as shown in FIG. 4A, through a transistor-based drive circuit 400 that may be a dual-rail inverter structure comprising transistors $T_P$ and $T_N$. FIG. 4B is a timing diagram illustrating the application of $V_{FE}$, $V_{PROP}$, and $V_{RST}$ signals to the devices of FIG. 4A, in accordance with some examples of this disclosure. FIG. 4B also shows the application of the different input excitations and the output signal. The signal $V_{RST}$ turns on transistors $T_{RST}1$ and $T_{RST}2$ in the two logic stages to charge the respective FE capacitors.

FIG. 4A also depicts reset circuits 410A-410C. Reset circuit 410A may be a part of the output circuit of the first electronic device, and reset circuit 410C may be a part of the output circuit of the second electronic device. For example, reset circuit 410A may be configured to clear the voltage across output FE capacitor 404 in response to voltage signal $V_{RST}$. When voltage signal $V_{RST}$ has an active value, electricity may flow through $T_{RST}1$ to a reference voltage such as GND.

The output voltage induced through the IME effect, $V_{OUT1}$, turns on either $T_N$ or $T_P$, depending on its polarity. These transistors form an inverter and set $V_{FE}$ for the next stage to a polarity opposite that of $V_{OUT1}$. The result of the operation is retained in the PMA-FM when the supply voltage is removed. This allows the realization of nonvolatile logic with COMET. As a result, the inverter can be power-gated after signal transfer, saving leakage. Unlike the charge transfer scheme with 6:1 ratioing between stages and repeated amplification, the example techniques allow all stages to be unit-sized, resulting in area and energy efficiency. This scheme also allows efficient charge-based cascading of logic stages as opposed to spin-based cascading, which require a large number of buffers to overcome the spin losses in the interconnects.

The electronic device may include transistor-based drive circuit 400 electrically connected to an output node of output FE capacitor 404. The output node may have an electrical potential of $V_{OUT1}$. In some examples, transistor-based drive circuit 400 may include two transistors ($T_P$ and $T_N$) configured to operate as an inverter circuit, such that $V_{OUT1}$ and $V_{OUT}$ have opposite binary values (i.e., a high value and a low value). Transistor-based drive circuit 400 may be configured to deliver a voltage signal (i.e., $V_{OUT}$) to input FE capacitor 406 of a second electronic device, which is the structure on the right side of FIG. 4A. The inverter circuit shown in FIG. 4A is only one example of a transistor-based output circuit that may be configured to deliver an output signal from the first device to a second device.

Transistor-based drive circuit 400 may be configured to receive the voltage change ($V_{OUT1}$) from output FE capacitor 404 at the gates of transistors $T_P$ and $T_N$ (e.g., high-side and low-side transistors). The drain terminals of $T_P$ and $T_N$ may be electrically connected to each other and to the input node of input FE capacitor 406. In some examples, the drain terminals may be electrically connected to an input node of another device. In some examples, transistor-based drive circuit 400 may be configured to deliver $V_{OUT}$ to the input node of a second device that may be a transistor-based device, a CMOS-based device, a spintronics device, and/or another other suitable device. The voltage signal ($V_{OUT}$) may be an inverted form of the signal ($V_{OUT1}$) at the output node of output FE capacitor 404.

A transistor-based drive circuit may also be electrically connected to the output nodes of other devices. For example, a transistor-based drive circuit may also be electrically connected to the output node of a majority gate device. In some examples, the output node of the output FE capacitor of the majority gate device may be electrically connected to the gate terminal of a high-side transistor (e.g., $T_P$) and the gate terminal of a low-side transistor (e.g., $T_N$) of a transistor-based drive circuit.

Figure 4C:
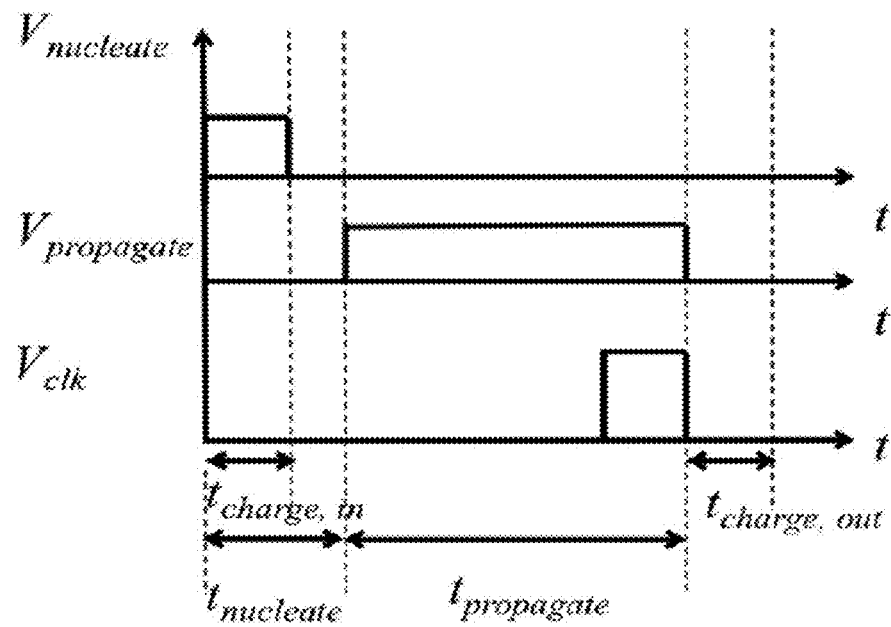

FIG. 4C is a timing diagram illustrating the operation of electronic device 100 of FIG. 1, in accordance with some examples of this disclosure. The operation of electronic device 100 can be understood with the help of the timing diagram in FIG. 4C. A voltage, Vsupply, applied for time $t_{charge,in}$, induces electrical charge on input FE capacitor 102, when $V_{nucleate}$ (transistor T1) is turned on (i.e., when $V_{FE}$ is applied). This change in the electric polarization of input FE capacitor 102 couples with the magnetization of FM channel 106 beneath it. The resultant effective field from the magnetoelectric coupling nucleates a DW in FM channel 106 beneath input FE capacitor 102 at time $t_{nucleate}$. The DW in FM channel 106 is then propagated to the output by turning on $V_{propagate}$ (transistor T2, i.e., $T_{PROP}$), causing an electric current density, J, to pass through HRM 110, injecting a lateral spin current into FM channel 106 through SHE. The combination of SHE and DMI permits fast DW propagation. Turning on $V_{clk}$ (i.e., activating $T_{RST}$) just before the DW reaches the output end introduces electric charge on output FE capacitor 104. The change in the magnetization of FM channel 106 underneath output FE capacitor 104 induces charge on it by inverse ME coupling. This charge (i.e., $V_{OUT}$) can be transferred to the next logical stage, which may be another electronic device and/or a transistor-based device.

Figure 5A:
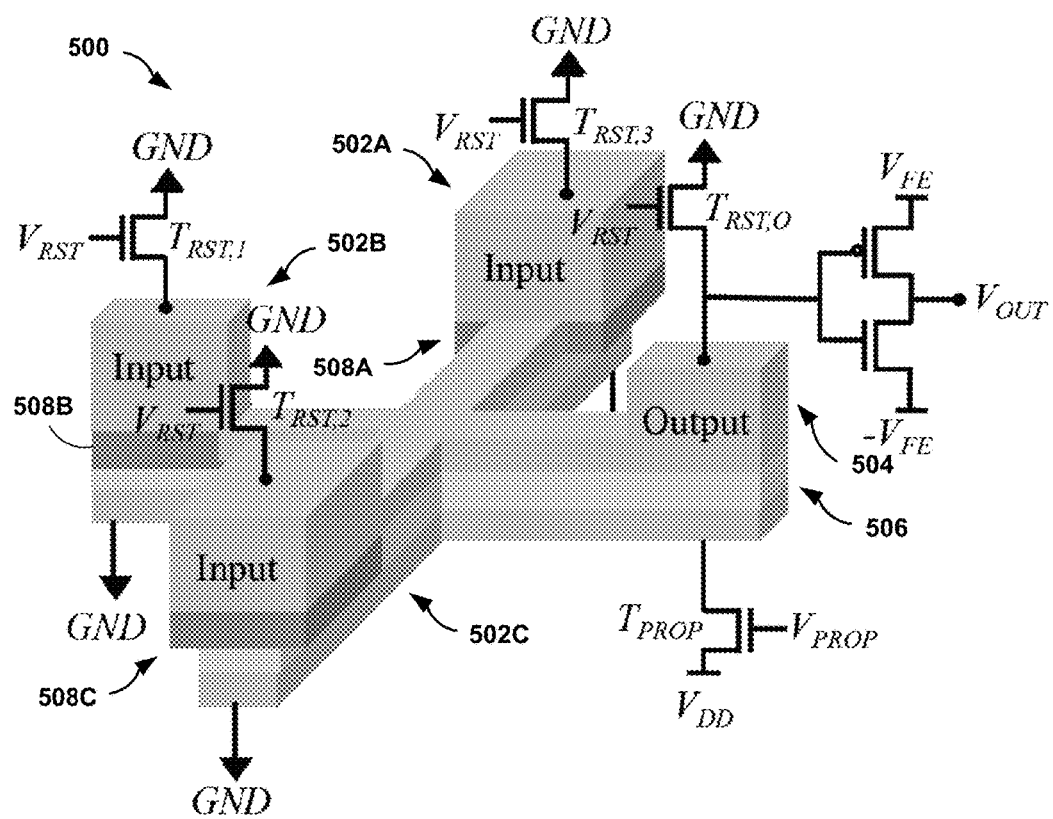
FIG. 5A illustrates the structure of an example three-input majority gate device, in accordance with some examples of this disclosure.

FIGS. 5A, 5B, and 5D illustrate the structure of a three-input majority gate devices 500 and 550, in accordance with some examples of this disclosure. FIGS. 5C and 5E are tables providing example dimensions of three-input majority gate devices 500 and 550 of FIGS. 5A, 5B, and 5D. The example illustrated in FIG. 4A may be extended to build a three-input COMET majority gate (MAJ3) 500, as shown in FIG. 5A. The input voltage $V_{FE}$ is applied to each input to nucleate a DW in PMA-FM channel 506 below each $FE_{in}$. The DWs from each input is propagated to the output by turning on $T_{PROP}$. The DWs compete in the PMA-FM channel 506, and the majority prevails to switch $FE_{out}$ using the IME effect. Subsequent gates are cascaded using the dual-rail inverter scheme described above.

Electronic device 500 of FIG. 5A may include at least three input FE capacitors 502A-502C, each of which are positioned above PMA-FM channel 506. FM channel 506 may be configured to carry the signal by at least carrying the signal (e.g., a change in magnetization state, DW, etc.) from a majority of the at least three input FE capacitors 502A-502C to the output FE capacitor 504. If a majority of the input FE capacitors 502A-502C receive an input voltage signal, the DWs caused by the input voltage signal may win out over the magnetization state in FM channel 506 proximate the minority of input FE capacitor(s) 502A-502C. A change in magnetization state may propagate through the FM channel 506 from a majority of the input FE capacitors 502A-502C to the output FE capacitor 504. The change in magnetization state may propagate through the FM channel 506 in response to a voltage applied to a majority of the input FE capacitors 502A-502C. The electronic device 500 may include IMA-FM material 508A-508C adjacent to each of the input FE capacitors 502A-502C. The IMA-FM material 508A-508C may be positioned between the FM channel 506 and each of input FE capacitors 502A-502C.

Majority gates can be used to build AND gates and NAND gates, which may be used to build any logic circuitry. As one example, if one of input FE capacitors 502A-502C is set to a logic high, the voltage at output FE capacitor 504 would be based on the OR function of the voltages at other ones of input FE capacitors 502A-502C. In other words, by setting the voltage at one of input capacitors 502A-502C to a logic high, and allowing the inputs of the other input capacitors 502A-502C to be logic inputs, electronic device 500 may become an OR gate. As another example, if one of input FE capacitors 502A-502C is set to a logic low, the voltage at output FE capacitor 504 would be based on the AND function of the voltages at other ones of input FE capacitors 502A-502C. In other words, by setting the voltage at one of input capacitors 502A-502C to a logic low, and allowing the inputs of the other input capacitors 502A-502C to be logic inputs, electronic device 500 may become an AND gate.

The performance of a MAJ3 gate 500 can be modeled. The worst-case delay of this gate occurs when one input differs from the others. At feature size, F, the DW for each input nucleates in PMA-FM channel 506 below $FE_{in}$ at a distance 2F once $V_{FE}$ is applied. The DW from each input FE capacitor 502A-502C then travels a 4F distance to switch $FE_{out}$ as shown in FIG. 5B. The dimensions of the simulated structure, including the length (l), width (w), and height (h) are shown in FIG. 5C.

FIG. 5D is a top-view layout diagram of a three-input majority gate 550 device, in accordance with some examples of this disclosure. If F is the feature size for a technology, in FIG. 1, we set the dimensions of FE capacitors 552A-552C and 556 to 1F×1F×1 nm and FM channel 556 and HRM each to 5F×1F×1 nm based on analyzing a three-input majority gate layout (see FIG. 5D). The largest delay occurs when two logic inputs are different from the third, resulting in a single FE capacitor driving an FM interconnect (i.e., FM channel 556) of 5F. The thickness of FM channel 556 is set to 1 nm, enabling the choice of a material with perpendicular magnetic anisotropy. The current density, $J=9\times10^{10}$ A/m$^2$, is chosen to be below the electromigration limit.

Table I shows the simulation parameters for the experiment described herein. The IMA-FM 508A-508C aspect ratio (x:y) is set to 2:1 to align the magnetization of PMA-FM channel 506 at an angle to the easy axis (due to shape anisotropy). The $FE_{in}$ and $FE_{out}$ thicknesses are set to 5 nm to avoid leakage through the capacitors. The PMA-FM channel 506 thickness is set to 1 nm.

TABLE I

Simulation parameters used in the experiment described herein.

| Parameter | Value |
| --- | --- |
| Viscosity coefficient $\gamma_v$ [Vm · s/K] | $5.47 \times 10^{-5}$ |
| Vacuum permittivity, $\epsilon_0$ [F/m] | $8.85 \times 10^{-12}$ |
| Vacuum permeability, $\epsilon_0$ [T · m/A] | $1.25 \times 10^{-6}$ |
| Charge of the electron, e [C] | $1.60 \times 10^{-19}$ |
| Gyromagnetic ratio, $\gamma$ [rad/s · T] | $1.76 \times 10^{11}$ |
| Speed of light, c [m/s] | $3 \times 10^8$ |
| ME coefficient for $FE_{in}$, $\kappa_{ME}$ [s/m] | (0.2/c) or (0.1/c) |
| ME coefficient for $FE_{out}$, $\kappa_{IME}$ [s/m] | (1.4/c) or (0.1/c) |
| Resistivity of SHM, $\rho_{SHM}$ [Ω · m] | $1.06 \times 10^{-7}$ |
| FE permittivity, $\epsilon_{FE}$ | 164 |
| Adiabatic STT parameter, $\beta$ | 0.4 |
| DMI constant, |D| [mJ/m$^2$] | 0.8 or 0.5 |
| ME interface thickness, $h_{int}$ [nm] | 1.5 or 1.0 |
| Transistor threshold voltage, $V_{th}$ [V] | 0.2 |
| Bohr magneton, $\mu_B$ [J/T] | $9.274 \times 10^{-24}$ |
| 15 nm Transistor on-resistance, $R_{on}$ [Ω] | 3480 |
| 7 nm Transistor on-resistance, $R_{on}$ [Ω] | 4109 |
| Spin Hall angle, $\theta_{SHE}$ | 0.5 |
| Spin polarization, $P_{PMA-FM}$ | 0.5 |
| Transistor gate capacitance, $C_g$ [fF] | 0.1 |
| Current Density, J [A/m$^2$] | $9 \times 10^{10}$ |
| $V_{dd}$ [V] | 0.72 |
| $T_{PROP} R_{on}$ [Ω] | 1000 |
| Uniaxial anisotropy constant, $K_u$ [erg/cc] | $10^7$ |
| Damping constant, $\alpha$ | 0.05 |

Table II depicts additional parameters for the simulations. For different technology nodes, Table II includes the delay and energy for the three parameter sets. The corresponding DW velocities shown in Table II are in agreement with experimentally demonstrated ranges. Table II can be mapped to Heusler alloys as Ms and Ku are in the same range as that of MnGa. The HRM could be either Pt, β-Ta or β-W. For the FE capacitors, BaTiO$_3$ is a suitable candidate to couple with the FM layer. The damping constant, α, can be engineered to be set to 0.05 by adequately doping the FM. The choice of the exchange constant, A, is consistent with M. Fiebig, J. Phys. D, 2005, v. 38, pp. R123-R152. In summary, under an appropriate set of parameters, we show that delays of a few hundred ps and energy of about a few hundred aJ are achievable.

The energy dissipation may be dominated by the energy dissipated in the clocking transistors (transistor for $V_{FE}$ and $T_{RST}$) and the input FE capacitor and output FE capacitor. The dissipation in the HRM and $T_{PROP}$ may be insignificant. The delay may be dominated by the DW propagation. Table II also shows the total delay of the device for different technology nodes for each parameter set, the total energy of the device, the DW velocities obtained, and a list of parameter values considered in this experiment.

TABLE II

Simulation parameters for three simulation sets and three technology nodes used in the experiment described herein.

| Parameters | Set 1 | Set 2 | Set 3 |
|---|---|---|---|
| Exchange constant, A [μ erg/cc] | 1 | 0.28 | 0.68 |
| Saturation magnetization, $M_s$ [emu/cc] | 500 | 300 | 300 |
| Supply voltage, $V_{supply}$ [V] | 0.93 | 1.50 | 2.12 |
| Delay for 5-nm tech. node [ps] | 128 | 125 | 117 |
| Delay for 7-nm tech. node [ps] | 156 | 149 | 124 |
| Delay for 10-nm tech. node [ps] | 198 | 184 | 155 |
| Energy for 5-nm tech. node [aJ] | 67.4 | 130.6 | 212.0 |
| Energy for 7-nm tech. node [aJ] | 108.6 | 209.0 | 417.6 |
| Energy for 10-nm tech. node [aJ] | 173.4 | 375.6 | 701.0 |
| DW velocity [m/s] | 362 | 420 | 540 |

Below is a list of the governing equations for electronic device 100 of FIG. 1, in accordance with some examples of this disclosure. The operation of electronic device 100 was modeled using the equations (1)-(10) below. Using these equations, the delay of electronic device 100 may be the sum of the time it takes to (a) nucleate a DW ($t_{nucleate}$), (b) propagate the DW ($t_{propagate}$), (c) charge the output FE capacitor ($t_{charge,out}$), and (d) transfer the charge to next logical stage ($t_{qtransfer}$). The energy consumption of electronic device 100 may be the sum of energy dissipated (a) in the transistor T2, in HRM and (b) while charging the input and output FE capacitors 102 and 104. In our implementation, we use a micromagnetics simulator OOMMF (Object Oriented MicroMagnetic Framework) to obtain $t_{nucleate}$ and perform the rest of the computation in Matlab.

The dynamics of electric polarization, $\vec{P}$, of FE$_{in}$ due to $E_{FE}(=V_{FE}/h_{FEin})$ as a result of the applied voltage $V_{FE}$ across the thickness of input FE capacitor 502A (or 502B or 502C), $h_{FEin}$ are described by the Landau-Khalatnikov (LKh) equation:

$$\gamma_v \frac{\partial P_i}{\partial t} = -\frac{1}{a_{FEin}} \frac{\partial F_T}{\partial P_i} \quad (1)$$

In Equation (1), $F_T$ is the total free energy of the input structure as a function of $E_{FE}$, $\gamma_v$ is the viscosity coefficient, $P_i$ is the component of $\vec{P}$ in the i direction, and $a_{FEin}$ is the volume of input FE capacitor 502A. The resultant $\vec{P}$ generates an effective magnetic field from ME, $\vec{H}_{ME}$ given by Equation (2).

$$\vec{H}_{ME} = \frac{\kappa_{ME}}{\epsilon_0} \frac{h_{int}}{h_{FEin}} \vec{P} \quad (2)$$

Here, $h_{int}$ is the ME interface thickness, $h_{FEin}$ denotes the thickness of FE$_{in}$, and $\kappa_{ME}$ refers to the ME coefficient. The magnetic field, $H_{ME}$ is then applied as a Zeeman field to the composite structure in the micromagnetics simulator, OOMMF, which solves the Landau-Lifshitz-Gilbert (LLG) equation as shown below, to obtain $t_{nucleate}$.

$$\frac{(1+\alpha^2)}{\gamma} \frac{d\vec{M}}{dt} = -\vec{M} \times \vec{H}_{eff} - \alpha \vec{M} \times (\vec{M} \times \vec{H}_{eff}) \quad (3)$$

Here α refers to the damping constant and $\vec{M}$ denotes the magnetization in PMA-FM. The effective magnetic field, $\vec{H}_{eff}$ is given by Equation (4).

$$\vec{H}_{eff} = \vec{H}_{ME} + \vec{H}_K + \vec{H}_{demag} + \vec{H}_{ex} \quad (3)$$

where $\vec{H}_K$, $\vec{H}_{demag}$, and $\vec{H}_{ex}$ refer to the contributions to $\vec{H}_{eff}$ from magnetic anisotropy, the demagnetization field, and the exchange field in PMA-FM channel 506, respectively. The 1D equations that model DW motion describe its instantaneous velocity, dQ/dt and phase φ (depicted in FIG. 2B) through a pair of coupled differential Equations (5a) and (5b).

$$(1+\alpha^2)\frac{dQ}{dt} = -\gamma\Delta\frac{H_K}{2}\sin(2\phi) + \quad (5a)$$
$$(1+\alpha^2\beta)B_{STT} + \gamma\Delta\frac{\pi}{2}[\alpha H_{SHE}\cos(\phi) + H_{DMI}\sin(\phi)]$$

$$(1+\alpha^2)\frac{d\phi}{dt} = \quad (5b)$$
$$-\gamma\alpha\frac{H_K}{2}\sin(2\phi) + \frac{(\beta-\alpha)}{\Delta}B_{STT} + \gamma\frac{\pi}{2}[H_{SHE}\cos(\phi) + \alpha H_{DMI}\sin(\phi)]$$

The DW width, Δ is given by Equation (6).

$$\Delta = \frac{\sqrt{A/K_{U,PMA-FM}}}{\sqrt{1+\frac{\mu_0 M_{S,PMA-FM}^2}{K_{U,PMA-FM}}\left[\frac{h_{PMA-FM}}{h_{PMA-FM}+\Delta} - \frac{h_{PMA-FM}}{h_{PMA-FM}+w_{PMA-FM}}\right]\sin^2(\phi)}} \quad (6)$$

whereas the effective field from anisotropy ($H_K$), $S_{HE}$ ($H_{SHE}$), DMI ($H_{DMI}$), and field-like term from STT ($B_{STT}$) is given by Equations (7).

$$H_K = \frac{2K_{U,PMA-FM}}{M_{S,PMA-FM}}; \quad H_{SHE} = \frac{\hbar\theta_{SHE}J_c}{2\mu_0 e M_{S,PMA-FM}} \quad (7)$$
$$H_{DMI} = \frac{D}{\mu_0 M_{S,PMA-FM}\Delta}; \quad B_{STT} = \frac{\mu_B P_{PMA-FM}J_c}{e M_{S,PMA-FM}}$$

The contribution of BSTT to the motion of the DW in PMA-FM channel 506 is negligible compared to those from SHE and DMI. Here, A, $M_{S,PMA-FM}$, $P_{PMA-FM}$, $h_{PMA-FM}$, $K_{U,PMA-FM}$, $\theta_{SHE}$, and D refer to the exchange constant, PMA-FM saturation magnetization, PMA-FM polarization ratio, PMA-FM thickness, PMA-FM uniaxial anisotropy, adiabatic STT parameter, spin-Hall angle, and DMI constant, respectively. The average DW velocity is used to calculate $t_{propagate}$.

The electric field developed across $FE_{out}$ from IME effect, $\vec{E}_{IME}$, due to the magnetization, $\vec{M}$ in PMA-FM channel 506 is used to calculate $V_{OUT}$ as shown in Equations (8). $\kappa_{IME}$ is the inverse ME coefficient, $h_{int}$ is the interface thickness, and $h_{FEout}$ refers to the thickness of the output FE capacitor 504.

$$\vec{E}_{IME} = K_{IME} \frac{h_{int}}{h_{FE_{out}}} \vec{M} \tag{8}$$

$$V_{OUT} = \vec{E}_{IME} h_{FE_{out}}$$

The time, $t_{qtransfer}$, required to transfer $V_{OUT1}$ to the input of the next stage includes the delay of the dual-rail inverter and the RC delay of the wire from the inverter output to $FE_{in}$ of the next stage. The delay and energy of a K-input COMET majority gate are shown in Equations (9).

$$T_{COMET}=2(t_{nulcleate}+t_{propagate}+t_{qtrasfer})$$

$$E_{COMET}=2(E_{FE}+E_{TX}+E_{Joule}+E_{leakage}) \tag{9}$$

where $E_{FE}$, $E_{TX}$, $E_{Joule}$, and $E_{leakage}$, respectively, refer to the energy for charging the $FE_{in}$, turning the transistors on, SHM Joule heating, and due to transistor leakage currents. The factor of 2 is due to PMA-FM magnetization initialization of each input to a state that allows DW nucleation. Finally, Equations (10) define the energies of Equations (9).

$$E_{TX}=(C_g/2)((K+1)V_{RST}^2+V_{PROP}^2+2V_{OUT}^2);$$

$$E_{Joule}=(J_c w_{SHM} t_{SHM})^2[R_{on}+R_{SHM}]t_{propagate};$$

$$E_{FE}=(K/2)C_{FE_{in}}V_{FE}^2; R_{SHM}=(\rho_{SHM} l_{SHM})/(w_{SHM} t_{SHM}) \tag{10}$$

Here, $C_g$, $C_{FEin}$, $R_{on}$, and $R_{SHM}$ refer to the transistor gate capacitance, capacitance of input FE capacitor 502A, transistor on-resistance, and resistance of the SHM, respectively. The length, width, and thickness of the SHM, are respectively, given by l, w, and h, each with subscript SHM.

Figure 6:
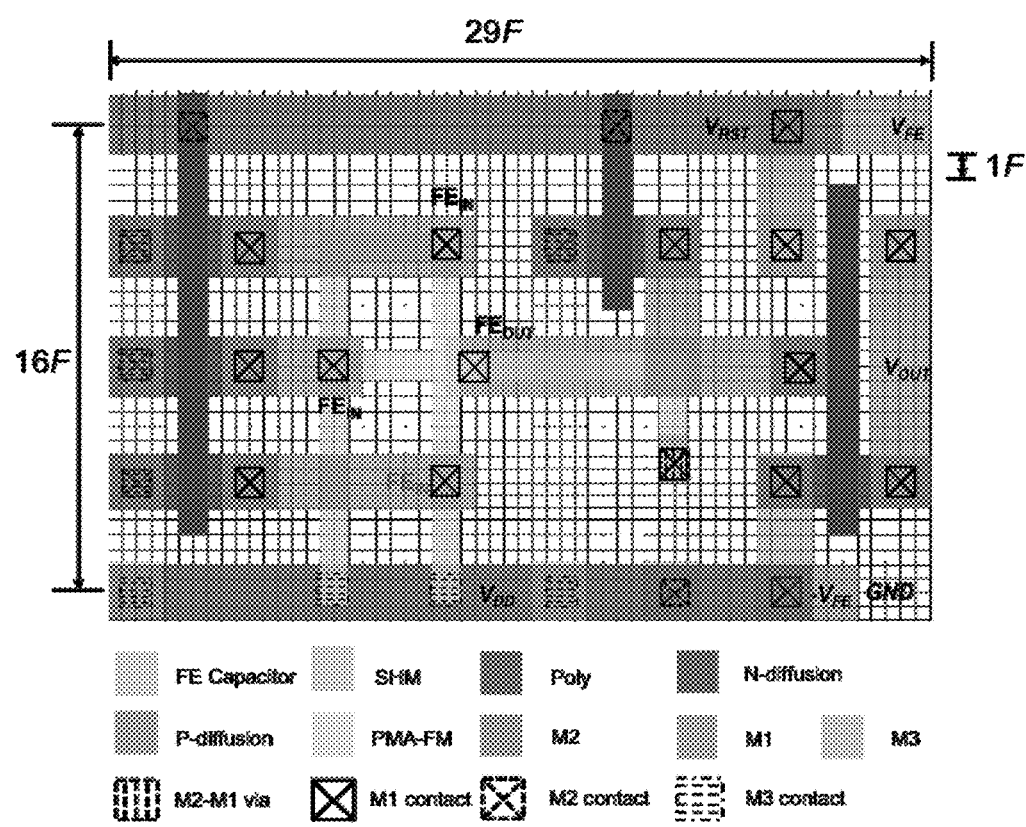
FIG. 6 illustrates the layout of a three-input majority gate device, in accordance with some examples of this disclosure.

FIG. 6 illustrates the layout of a three-input majority gate device, in accordance with some examples of this disclosure. The layout of MAJ3 corresponding to the schematic shown in FIGS. 5A-5C for a chosen value of F, is shown in FIG. 6. The layout was designed according to the design rules for F. The reset transistor for each input FE capacitor i, $T_{RST,i}$, with i∈1; 2; 3, and the reset transistor for the output FE capacitor, $T_{RST,o}$, are local to the majority gate as shown in the layout. The transistor required to send a charge current through the SHM, $T_{PROP}$, is shared globally by multiple gates. The dual-rail inverter is local to the majority gate and transfers the information to the next stage. The area of the MAJ3 gate is 29F×16F nm².

The delay of the device is a function of the dimensions of IMA-FM and PMA-FM material parameters, specifically $M_{S,PMA-FM}$, $K_{U,PMA-FM}$, A, and α. The design space consisting of the combination of these parameters may be used to analyze their impact on device performance. The results of the design space exploration for F=15 nm show two sample design points for F set to 15 nm and 7 nm.

The simulation parameters and their values used in this work are listed in Table III-A. The parameter space is chosen to reflect realistic values: the choice of A ∈ {10 pJ/m, 20 pJ/m, 30 pJ/m, 40 pJ/m} is chosen to reflect the typical exchange constant of existing and exploratory ferromagnetic materials. Lowering A further would make the Curie temperature too low. The choice of $M_{S,PMA-FM}$∈{0.3×10⁶ A/m, 0.4×10⁶ A/m, 0.5 10⁶ A/m} and $K_{U,PMA-FM}$∈{0.5×10⁶ J/m³, 0.6×10⁶ J/m³, 1×10⁶ J/m³} allow the mapping of PMA-FM materials to existing materials. The choice of α∈{0.01, 0.05, 0.08, 0.1} is free of any constraint to material mapping as it can be modified by adequately doping the PMA-FM. The saturation magnetization of the IMA-FM, $M_{S,IMA-FM}$ is set to 1×10⁶ A/m. The value of A and α for the IMA-FM is set to the same value as that of PMA-FM.

FIGS. 7A-7D illustrate the nucleation of a DW in PMA-FM material, in accordance with some examples of this disclosure. FIGS. 7A-7D illustrate estimates of $t_{nucleate}$ in OOMMF when the DW nucleates beneath the IMA-FM as shown in the snapshots in FIG. 7A. The experiment first relaxes the composite structure in OOMMF for 200 ps before applying the effective ME field as a Zeeman field. This time period allows the PMA-FM to reach an equilibrium state before the DW is nucleated. In a typical circuit, this state could be achieved by the PMA-FM in the time interval between successive switching activity. At the end of 200 ps, denoted in the figure as $t_1$=0 ps, the magnetization of the PMA-FM rests at an angle to the easy axis owing to the strong exchange coupling with the IMA-FM. After applying a Zeeman field, the DW nucleates in PMA-FM at 2F after a delay of 44 ps.

FIGS. 7A-7D compare the voltages required to nucleate the DW in the PMA-FM at approximately the same $t_{nucleate}$, in the absence of the IMA-FM on top of the PMA-FM to provide the initial angle. The procedure to calculate $t_{nucleate}$ is identical to the experiment in FIG. 7A. This analysis is performed for two cases: (i) when the applied Zeeman field acts on a region 2F×1F×1 nm corresponding to the scenario shown in FIG. 7B. The DW nucleates at $t_{nucleate}$=44 ps at 2F. However, $V_{FE}$ required to generate the DW is now 350 mV. After relaxing the magnetization for 200 ps, an absence of IMA-FM translates to a very low initial angle at $t_1$=0 ps which necessitates a stronger effective ME field, $H_{ME}$, and therefore a higher $V_{FE}$ to nucleate the DW for a given $t_{nucleate}$. (ii) The absence of IMA-FM allows us to further compact the COMET device such that the FE capacitor dimensions are the minimum possible at a chosen value of F. This corresponds to the dimensions, 1F×1F×5 nm (as opposed to those shown in FIG. 5C), the region from the left end of PMA-FM on which $H_{ME}$ acts. The voltage required to nucleate the DW at 1F, as shown in FIG. 7C, is close to 1V. From these two experiments, the composite structure facilitates a fast and energy-efficient DW nucleation.

FIG. 7A illustrates DW nucleation in PMA-FM material with the composite structure used in this work. FIG. 7B illustrates DW nucleation without the composite structure, i.e., without the IMA-FM with the ME field applied for a region 2F×1F×1 nm from the left end of PMA-FM. FIG. 7C illustrates DW nucleation without the composite structure with the ME field applied for a region 1F×1F×1 nm from the left end of PMA-FM. In FIG. 7A, the red region refers to the IMA-FM, and the blue region refers to PMA-FM in FIGS. 7A-7C. The material parameters used in the OOMMF simulation are: $M_{S,PMA-FM}$=0.5×10⁶ A/m, $K_{U,PMA-FM}$=0.6×10⁶ J/m³, A=10 pJ/m, α=0.01. The voltages required to nucleate the DW at $t_{nucleate}$=44 ps corresponding to $V_{FE}$=110 mV in FIG. 7A, $V_{FE}$=350 mV in FIG. 7B, and $V_{FE}$=1.06V in FIG. 7C. FIG. 7D shows DW formulation process in OOMMF for parameter Set 1.

Figure 8:
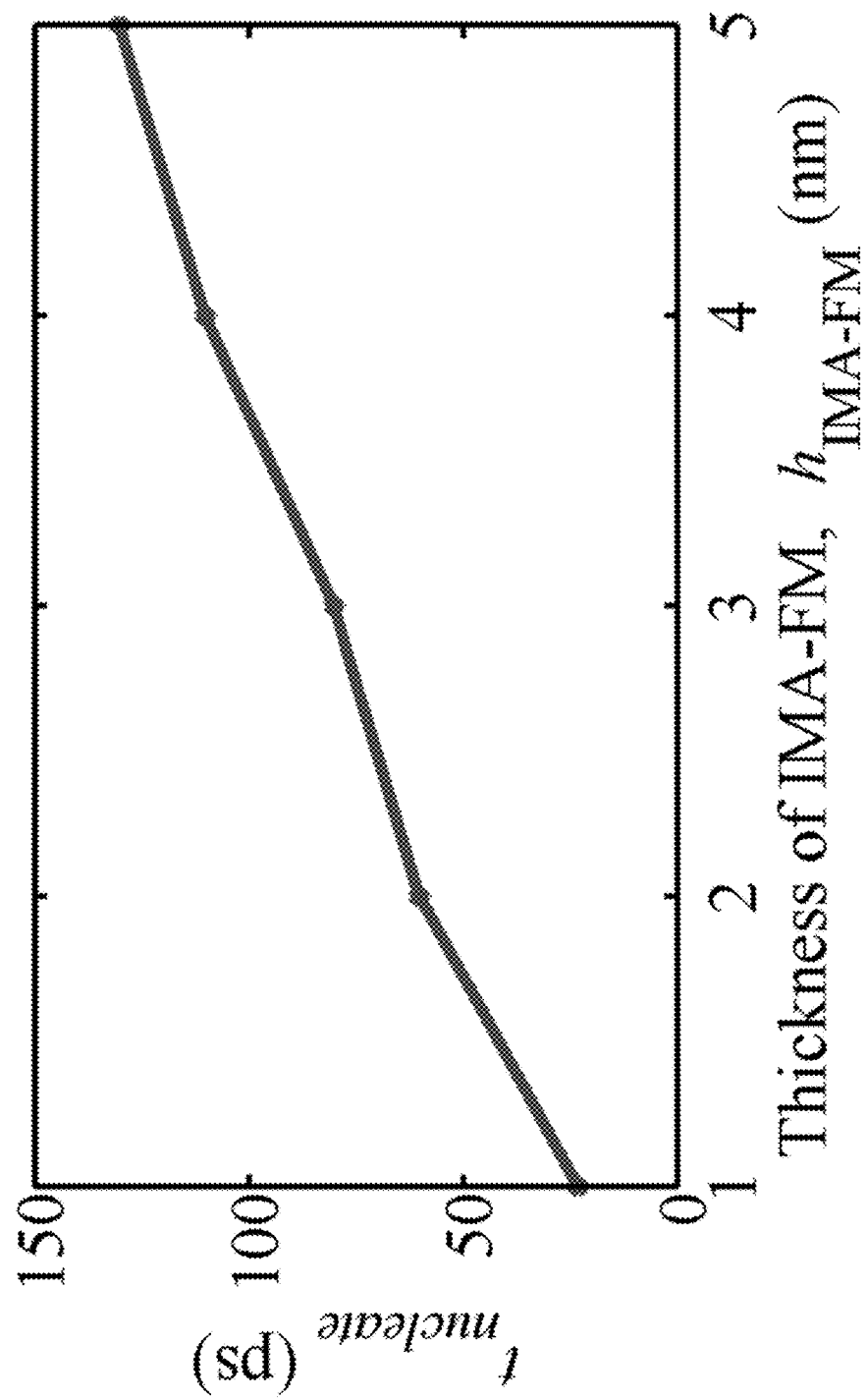
FIG. 8 illustrates the nucleation delay as a function of the IMA-FM thickness, in accordance with some examples of this disclosure.

FIG. 8 illustrates the nucleation delay as a function of the IMA-FM thickness, in accordance with some examples of this disclosure. FIG. 8 illustrates the nucleation delay, $t_{nucleate}$, of the COMET device for F=15 nm, as a function of the IMA-FM thickness, $h_{IMA-FM}$. The PMA-FM material parameters used in the OOMMF simulation are: $M_{S,PMA-FM}=0.3\times10^6$ A/m, $K_{U,PMA-FM}=0.5\times10^6$ J/m³, A=10 pJ/m and α=0.05 (similar trends are seen for other parameter choices). The nucleation of DW in the PMA-FM is not only a function of PMA-FM material parameters, but also depends on the material dimensions of the IMA-FM. The aspect ratio of the IMA-FM may be set to 2:1 to obtain the shape anisotropy necessary for the coupling with PMA-FM. $t_{nucleate}$ may depend on the thickness of IMA-FM, $h_{IMA-FM}$, as shown in the results in FIG. 8. As $h_{IMA-FM}$ increases, it becomes harder to switch the PMA-FM due to strong exchange coupling between IMA-FM and PMA-FM, increasing $t_{nucleate}$. Therefore, $h_{IMA-FM}=1$ nm was selected.

Figure 9A:
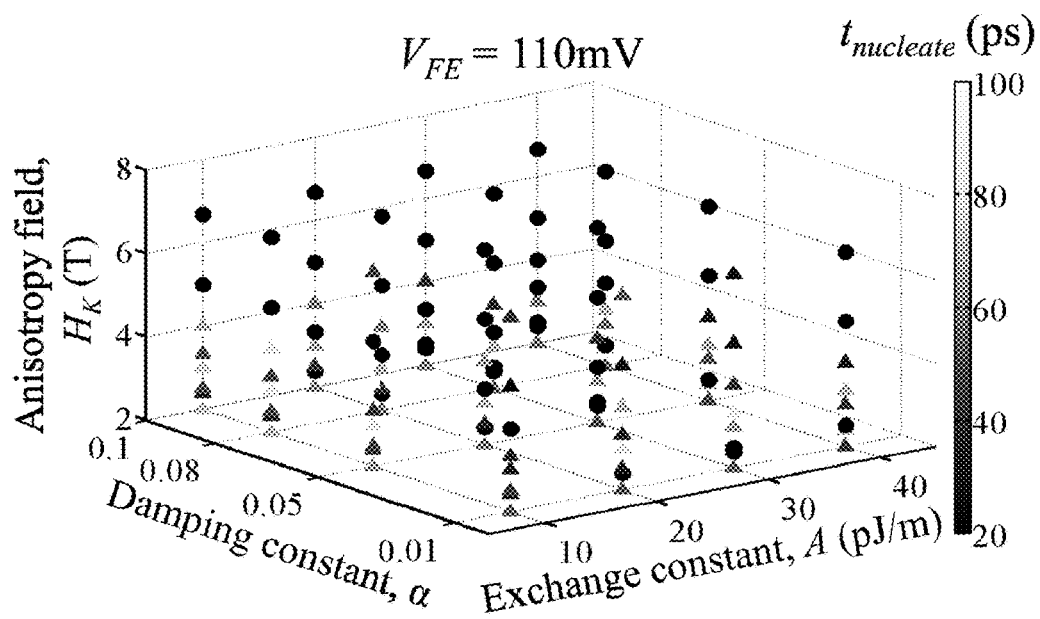
FIGS. 9A and 9B illustrate the nucleation delay as a function of $V_{FE}$, in accordance with some examples of this disclosure.
Figure 9B:
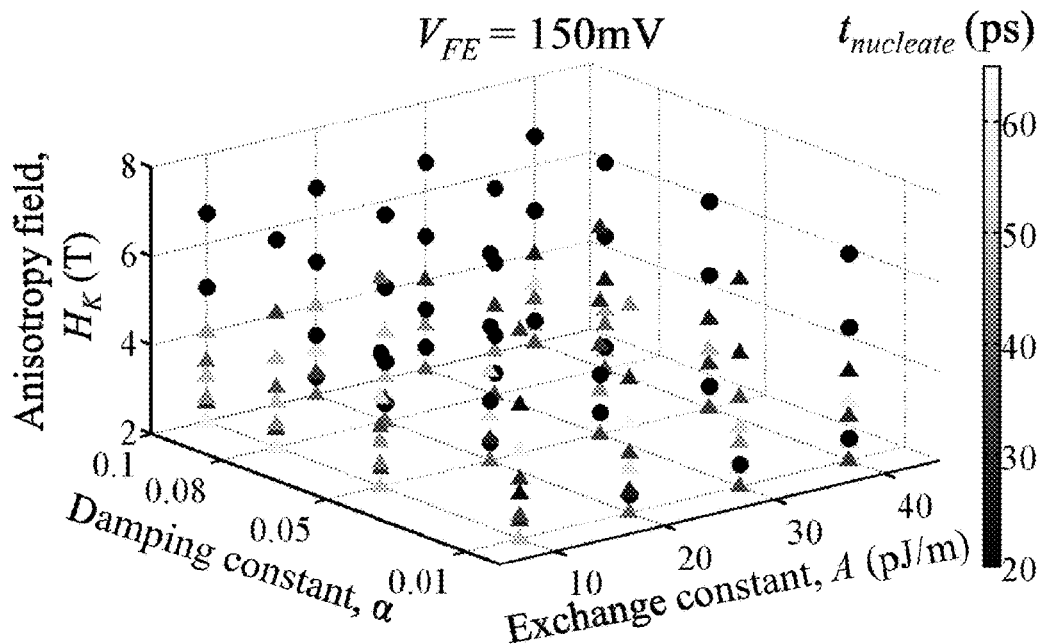

FIGS. 9A and 9B illustrate the nucleation delay as a function of $V_{FE}$, in accordance with some examples of this disclosure. FIGS. 9A and 9B illustrate the nucleation delay, $t_{nucleate}$, of the COMET device for F=15 nm as a function of material parameters for $V_{FE}=110$ mV in FIG. 9A and material parameters for $V_{FE}=150$ mV in FIG. 9B. The triangles indicate successful nucleation and while the circles indicate unsuccessful nucleation. The impact of material parameters of PMA-FM on $t_{nucleate}$ is shown in FIGS. 9A and 9B for $V_{FE}=110$ mV and $V_{FE}=150$ mV, respectively. It is seen that (a) a larger $V_{FE}$ reduces $t_{nucleate}$, and this can be shown to be consistent with the DW nucleation; see Equations (1)-(3). A larger $V_{FE}$ corresponds to a larger $E_{FE}$ across $FE_{in}$, which in turn creates a larger $H_{ME}$ to nucleate the DW faster. (b) Lower values of $H_K$ are more conducive to nucleation; a lower anisotropy field makes it easier for $H_{ME}$ to switch the magnetization between the two easy axes and (c) low values of A reduce $t_{nucleate}$ owing to the weaker exchange coupling with the neighboring magnetic domains of the PMA-FM. For A>10 pJ/m, the number of design points at which the nucleation does not occur increases. Therefore, the lowest value of A=10 pJ/m may be selected. This choice does not restrict the design search space for DW propagation as $t_{propagate}$ is primarily dictated by the choice of $M_{S,PMA-FM}$.

Figure 10B:
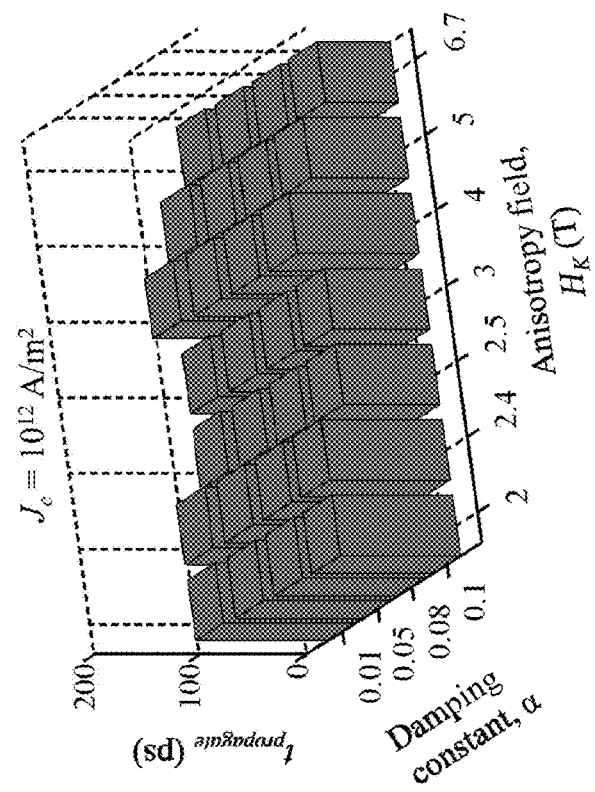
FIGS. 10A-10C illustrate DW propagation delays and DW velocity, in accordance with some examples of this disclosure.
Figure 10A:
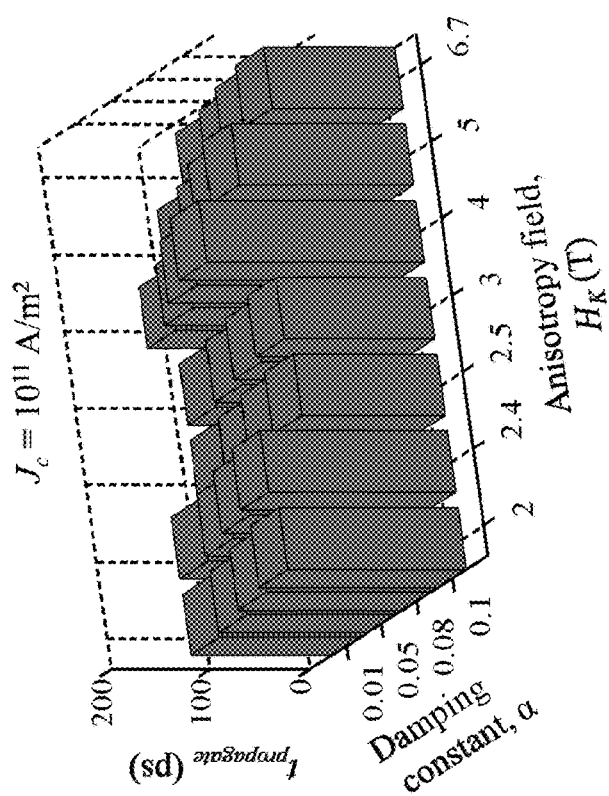
Figure 10C:
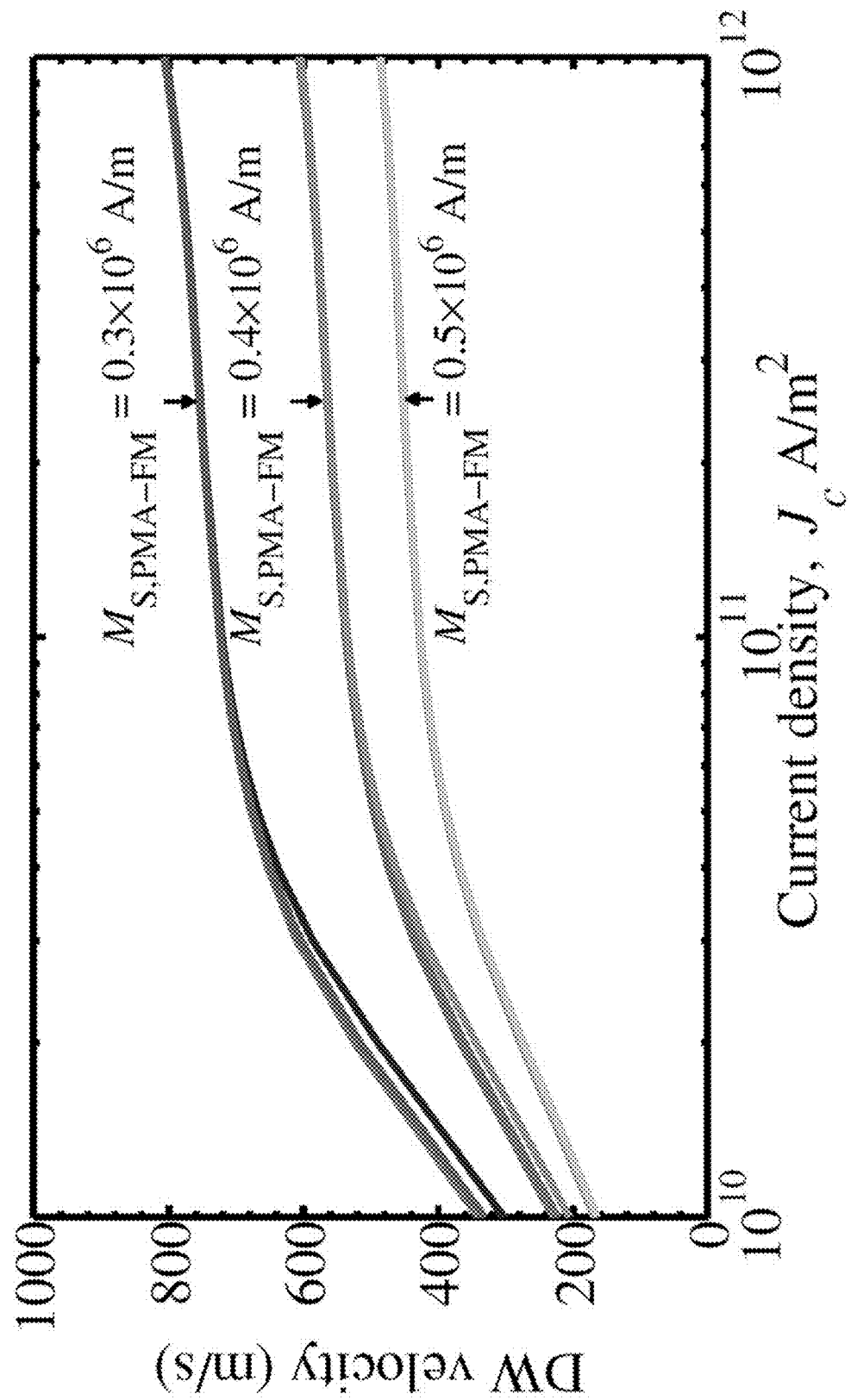

FIGS. 10A-10C illustrate DW propagation delays and DW velocity, in accordance with some examples of this disclosure. With this choice, $t_{propagate}$ for $J_c=10^{11}$ A/m² and $10^{12}$ A/m² is shown in FIGS. 10A and 10B, respectively. Increasing $J_c$ increases the torque from SHE as seen from the expressions for $H_{SHE}$ in Equation (7). This can be seen from FIG. 10C where increasing $J_c$ increases the DW velocity, thereby reducing $t_{propagate}$. These curves lie in three clusters, and show the dominance of $M_{S,PMA-FM}$ over other parameters.

This can also be seen from FIGS. 10A and 10B where the lowest $t_{propagate}$ bars ($H_K=6.7$ T) correspond to $M_{S,PMA-FM}=0.3\times10^6$ A/m. This is consistent with the Equation (7): a lower $M_{S,PMA-FM}$ implies higher $H_{SHE}$ and $H_{DMI}$, and therefore higher DW velocity. DW propagation delay, tpropagate, of the COMET device for F=15 nm as a function of the material parameters for A=10 pJ/m with $J_c=10^{11}$ A/m² in FIG. 10A, and $J_c=10^{12}$ A/m² in FIG. 10B. FIG. 10C shows DW velocity as a function of the current density, $J_c$, for all of the design points shown in FIGS. 10A and 10B. Note that points on the x and y axes of the bar chart in FIGS. 10A and 10B are not equally spaced.

Figure 11A:
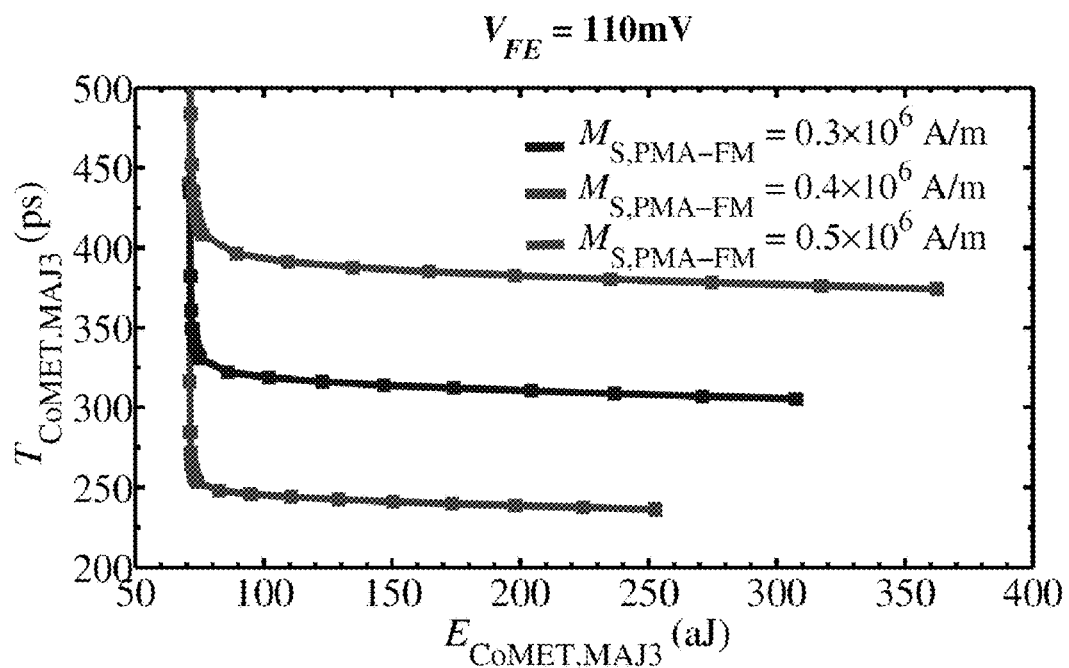
FIGS. 11A and 11B illustrate energy versus delay of a majority gate device, in accordance with some examples of this disclosure.
Figure 11B:
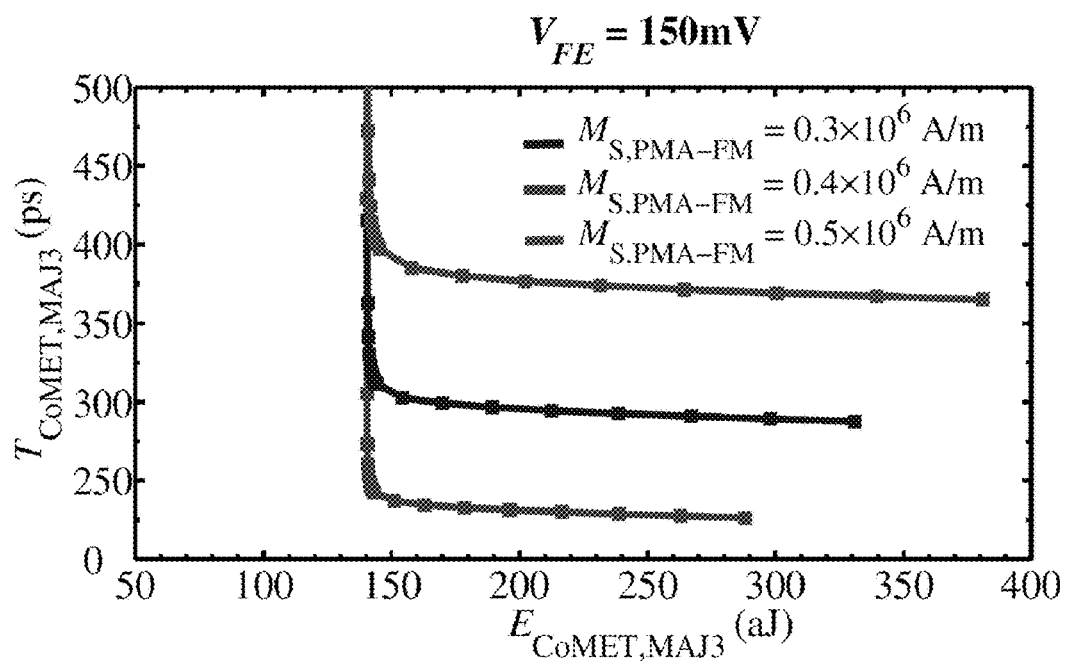

FIGS. 11A and 11B illustrate energy versus delay of a majority gate device, in accordance with some examples of this disclosure. Energy vs. delay of the COMET-based MAJ3 gate for three design points, corresponding to the $M_{S,PMA-FM}$ values for the clusters in FIG. 10C for $V_{FE}$. Other parameter values include α=0.01, A=10 pJ/m, $K_{U,PMA-FM}=0.5\times10^6$ J/m³.

For the three $M_{S,PMA}$ corresponding to each of the three clusters in FIG. 10C, $T_{CoMET}$ VS. $E_{CoMET}$ is plotted for MAJ3 in FIGS. 11A and 11B for the two values of $V_{FE}$. The dual-rail inverter delay, $t_{qtransfer}$, is calculated using the PTM technology models. For a chosen $M_{S,PMA-FM}$ and $V_{FE}$, the energy-delay data points are obtained by increasing $J_c$ from $10^{10}$ A/m² to $10^{12}$ A/m² in discrete steps. The main observations from FIGS. 11A and 11B are as follows.

Increasing $V_{FE}$ is seen to reduce $T_{CoMET}$ by reducing $t_{nucleate}$, at the expense of a larger $E_{CoMET}$. A higher $J_c$ corresponds to lower $T_{CoMET}$, but $E_{CoMET}$ is only marginally higher since it is primarily dominated by the transistor energy. Initially when $J_c$ increases, $T_{CoMET}$ reduces at the same rate as $J_c$, thus keeping the energy approximately constant. After a certain point, increasing $J_c$ only gives marginal improvements in delay. This result is consistent with FIG. 10C; as $J_c$ increases from $10^{10}$ A/m² to $10^{12}$ A/m², DW velocity increases sharply initially but only increases gradually later. A robust design point can be chosen such that $T_{CoMET}$ is less variable with material parameters. This corresponds to the right portion of each curve where the delay only improves marginally with increase in $J_c$.

FIGS. 12A and 12B are tables illustrating delay and energy of a majority gate device, in accordance with some examples of this disclosure. FIGS. 12A and 12B include the delay and energy of CoMET-based MAJ3/INV gate for F=15 nm in FIG. 12A and F=7 nm in FIG. 12B for the design point corresponding to parameters, $M_{S,PMA-FM}=0.3\times10^6$ A/m, $K_{U,PMA-FM}=0.5\times10^6$ J/m³, $J_c=5\times10^{11}$ A/m², α=0.01, and A=10 pJ/m. The best ($T_{CoMET}$, $E_{CoMET}$) for each $V_{FE}$ for MAJ3/INV for F=15 nm and F=7 nm are shown in FIGS. 12A and 12B, respectively. It can be seen that $t_{propagate}$ dominates $T_{CoMET}$ while $E_{CoMET}$ is dominated by energy associated with turning the transistors on and the corresponding leakage.

The delay and energy obtained using the CMOS technology given respectively by ($T_{CMOS}$, $E_{CMOS}$) for an inverter is (1.8 ps, 38.7 aJ) at F=15 nm and (1.6 ps, 19.8 aJ) at F=7 nm. For CMOS-based MAJ3 gate, the performance numbers are (14.8 ps, 704.2 aJ) at F=15 nm and (11.4 ps, 361.6 aJ) at F=7 nm. The CMOS performance numbers were obtained using the PTM technology models at nominal supply voltages of 0.85V for F=15 nm and 0.7V for F=7 nm. Thus, a MAJ3 gate can be implemented more energy-efficiently with COMET than with CMOS.

At these design points, $M_{S,PMA-FM}$, $K_{U,PMA-FM}$, and A can be mapped to MnGa-based Heusler alloy. The damping constant, α=0.01, can be engineered by choosing a new composition of PMA-FM. For the FE layer, $BiFeO_3$ (BFO) can be used, while the SHM could be β-W, Pt, β-Ta (i.e., platinum, tungsten, or tantalum), or some new materials under investigation. The oxide layer may include silicon dioxide or any other suitable oxide material.

An electronic device of this disclosure may operate as a spintronic logic device based on magnetoelectric effect and fast current-driven domain wall propagation. The composite input structure of an IMA-FM material placed in contact with a PMA-FM channel may allow the electronic device to operate at low voltages such as 110 mV and 150 mV. The output node of an electronic device may be electrically connected to an output circuit structure comprising a dual-rail inverter structure for efficient logic cascading. An optimized INV (see FIGS. 1-4A) may have a delay of 98.6 ps with energy dissipation of 68.4 aJ at 7 nm, while a MAJ3 gate (see FIGS. 5A-6) may run at 134.8 ps and 85.2 aJ.

A device such as COMET may integrate several different materials. One example for the fabrication of CoMET could proceed as follows. However, there may be other ways in which to fabricate the device. The following example results are based on the experimental results on individual components of the device.

At the input side, the deposition of PMA-FM on SHM, the IMA-FM on PMA-FM, and the FE layer on the IMA-FM can each be performed using the sputtering process. The PMA-FM/SHM structure has been widely investigated and has been experimentally demonstrated by several research groups. The exchange-coupled IMA-FM/PMA-FM structure has also been experimentally demonstrated, and is already used in hard-disk drives today. The experimental demonstrations done in show the deposition of an FE layer—BiFeO$_3$ (BFO) on an IMA-FM. Similarly, on the output side, the FE layer needs to be deposited directly atop the PMA-FM layer. BFO can be sputtered on a PMA material, FePt. The manufacturing processes of PMA-FM, IMA-FM, FE layer, and SHM, are CMOS-BEOL compatible.

Figure 13:
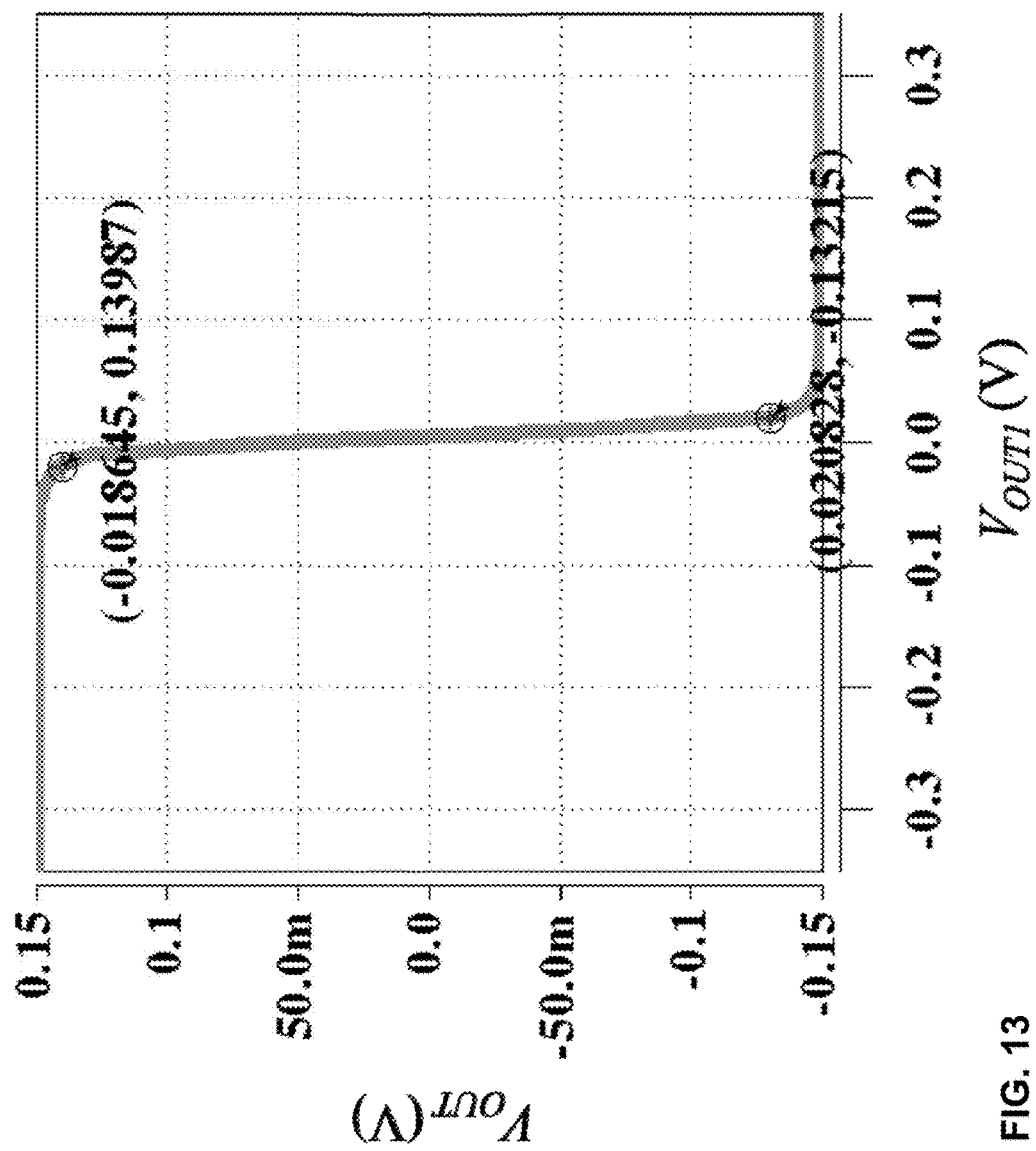
FIG. 13 is a graph illustrating the transfer characteristics of a complementary metal-oxide semiconductor (CMOS) inverter including two transistors used to cascade two electronic devices, in accordance with some examples of this disclosure.

FIG. 13 is a graph illustrating the transfer characteristics of a CMOS inverter including two transistors ($T_P$ and $T_N$) used to cascade two electronic devices, in accordance with some examples of this disclosure. The transfer characteristic of the dual-rail CMOS inverter used to cascade two COMET devices is shown in FIG. 13. It shows the voltage at the output of the dual-rail inverter, $V_{OUT}$, as the voltage at the input of the CMOS gate is swept from $V_{OUT1}$ to +$V_{OUT1}$ (referring to FIG. 9A) for F=15 nm. At the input of the CMOS inverter, $V_{OUT}$ changes from −0.35V to 0.35V when the domain wall reaches the output end of the PMA-FM interconnect and switches the FE layer. The output voltage, $V_{OUT1}$ switches from 150 mV to −150 mV. The noise margin (both high and low) is in the range of 110 mV.

Figure 14:
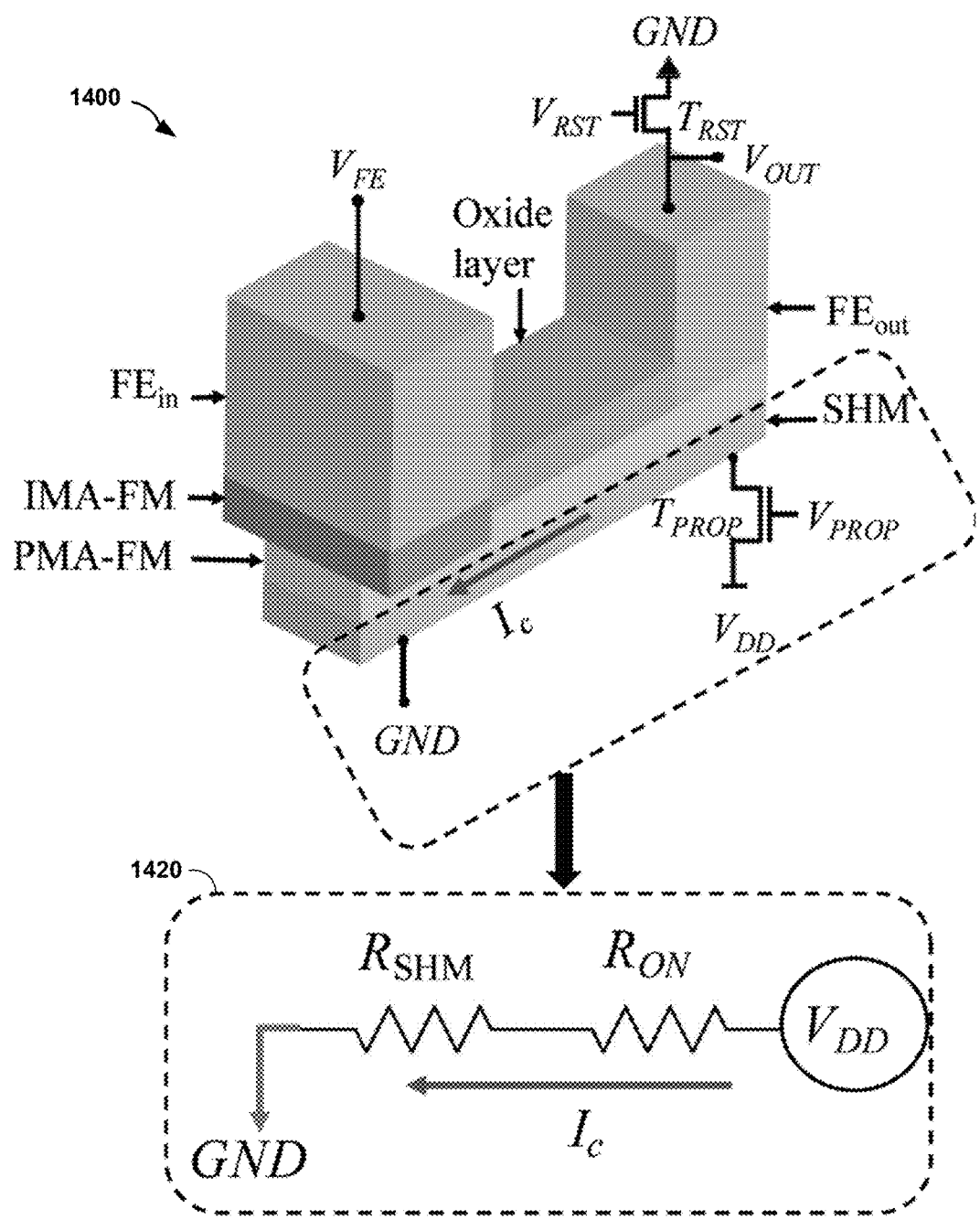
FIG. 14 illustrates an electrical circuit model for the calculation of the Joule dissipation energy for an inverter, in accordance with some examples of this disclosure.

FIG. 14 illustrates an electrical circuit model 1420 for the calculation of the Joule dissipation energy ($E_{Joule,inv}$) for a COMET inverter 1400, in accordance with some examples of this disclosure. The energy of the K-input COMET majority gate, $E_{CoMET}$, is calculated using Equation (9). This disclosure provides the details for calculating the Joule dissipation energy, $E_{Joule}$, component of $E_{CoMET}$. The electrical circuit model 1420 of an inverter for calculating $E_{Joule}$ is shown in FIG. 14. Here, $R_{ON}$, $R_{SHM}$, and $I_c$ refer to the on-resistance of the transistor, $T_{PROP}$, the resistance of SHM, and the charge current flowing in the SHM, respectively. It can be assumed that the charge current flows only through the SHM layer. Some part of the current would flow through the PMA-FM layer which is situated on top of the SHM layer. However, this current path may be ignored in the calculation of $E_{Joule}$ since the SHE due to the charge current flowing through the SHM is the primary driving force behind DW propagation as compared to the STT from the current flowing through the PMA-FM layer. The circuit model 1420 in FIG. 14 can be used to obtain Joule dissipation energy of the COMET inverter, $E_{Joule,inv}$, as shown in Equation (11).

$$E_{Joule,inv}=I_c^2[R_{on}+R_{SHM}]t_{propagate,inv} \quad (11)$$

where $I_c=J_c\omega_{SHM}t_{SHM}$. The width and the thickness of the SHM is denoted by $w_{SHM}$ and $t_{SHM}$, respectively, while $J_c$ and $t_{propagate,inv}$ denote the charge current density through the SHM layer and the DW propagation delay of the inverter, respectively. The on-resistance of the transistor is obtained using the PTM technology model. A single transistor can provide the charge current required to drive the DWs in multiple COMET devices. This can be achieved by connecting the SHM layer of several COMET devices in series. In this case, the circuit in FIG. 14 would reflect the effective SHM resistance, i.e., the sum of the resistances of the individual SHM resistors connected in series.

Figure 15:
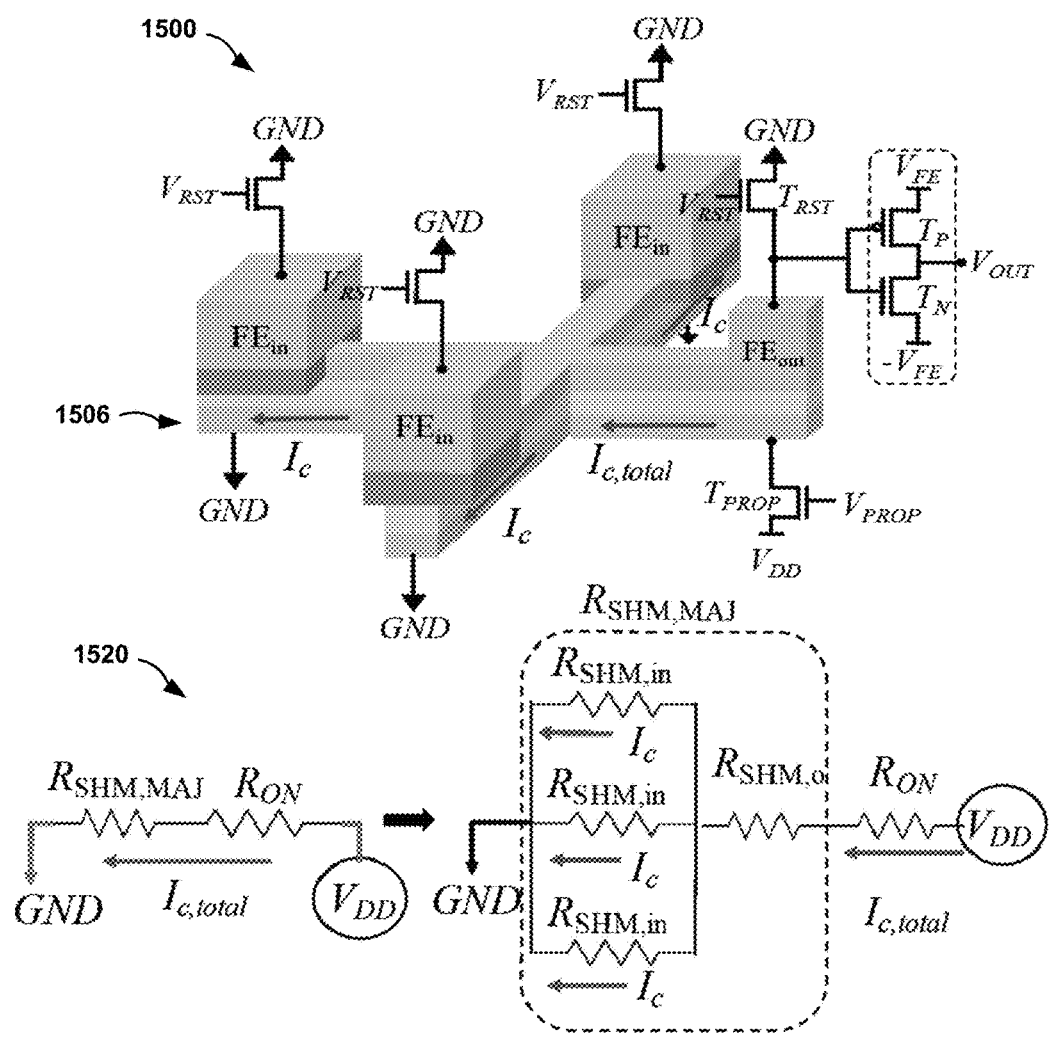
FIG. 15 illustrates an electrical circuit model for the calculation of the Joule dissipation energy for a majority gate, in accordance with some examples of this disclosure.

FIG. 15 illustrates an electrical circuit model 1520 for the calculation of the Joule dissipation energy ($E_{Joule,inv}$) for a COMET majority gate 1500, in accordance with some examples of this disclosure. Similarly, FIG. 15 shows electrical circuit model 1520 for calculating the Joule dissipation energy for COMET majority gate 1500. The effective resistance of the SHM layer 1506 for the majority gate is denoted by $R_{SHM,MAJ}$. This is calculated using the resistance network comprising of the three $R_{SHM,in}$, corresponding to the SHM resistance of the three input arms of the majority gate, connected in parallel. Together these are in series with $R_{SHM,o}$, the SHM resistance of the output branch of the SHM 1506 which is common to all the three inputs. The values of $R_{SHM,in}$ and $R_{SHM,o}$ are calculated using the layout and the dimensions of the SHM layer shown in FIGS. 5B and 5C. The Joule dissipation energy of the COMET majority gate, $E_{Joule,maj}$, can therefore be calculated in Equation (12).

$$E_{Joule,maj}=I_{c,total}^2[R_{on}+R_{SMH,MAJ}]t_{propagate,maj} \quad (12)$$

$t_{propagate,maj}$ and $I_{c,total}$ refer to the majority gate DW propagation delay and the net charge current flowing through the circuit, respectively. The energy and delay numbers in FIGS. 11A-12B are computed by applying the parameters from Table I to this model.

Figure 16:
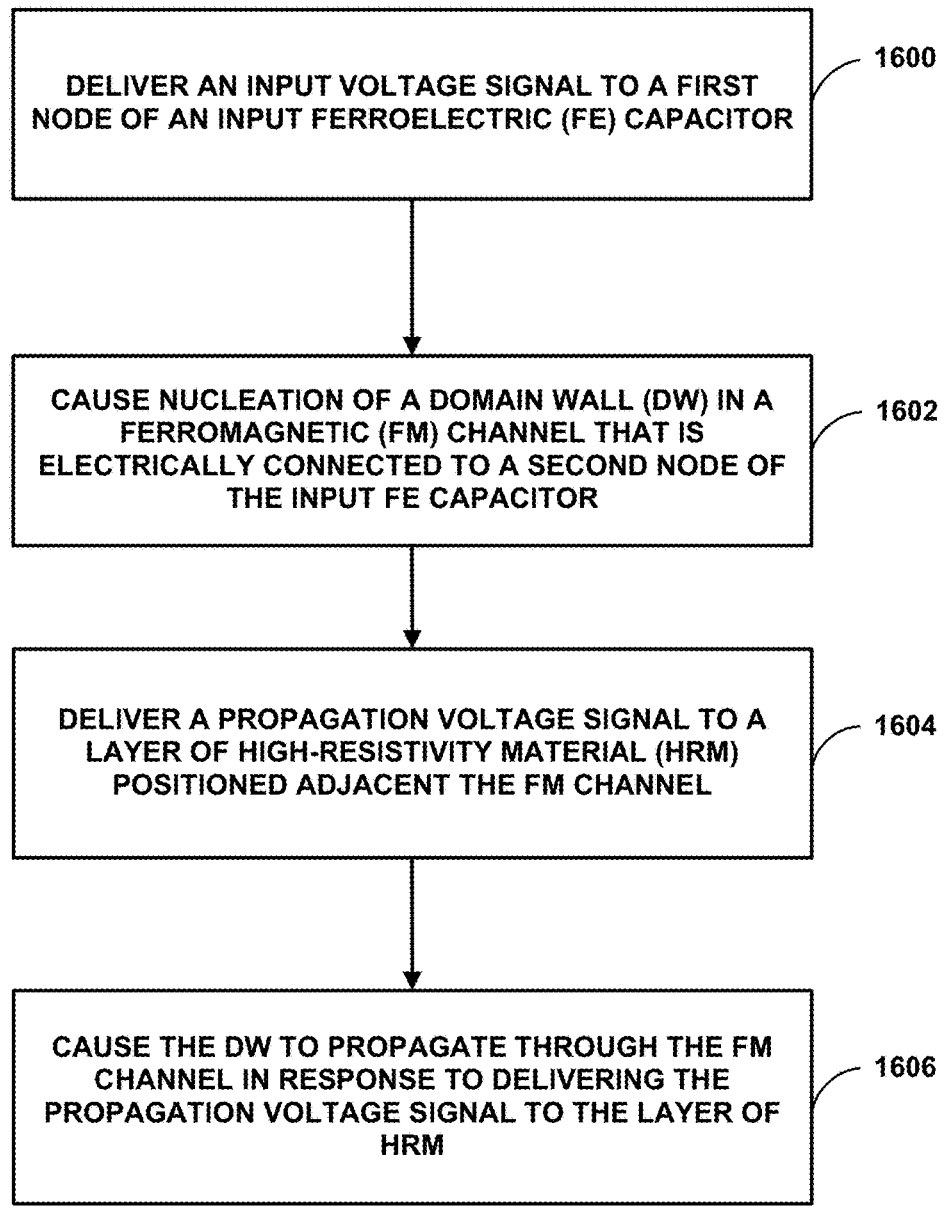
FIG. 16 is a flowchart illustrating example techniques for controlling the operation of an electronic device, in accordance with some examples of this disclosure.

FIG. 16 is a flowchart illustrating example techniques for controlling the operation of an electronic device, in accordance with some examples of this disclosure. The techniques of FIG. 16 are described with reference to the electronic device in FIG. 1, although other components, such as the electronic devices of FIGS. 2A-4A, 5A, 5B, 5D, 6, 14, and 15 may exemplify similar techniques.

The techniques of FIG. 16 include delivering an input voltage signal to a first node of input FE capacitor 102 (1600). Control circuitry may be configured to cause power supply circuitry to deliver the input voltage signal by at least closing a switch between the power supply circuitry and the first node of input FE capacitor 102. The control circuitry may be configured to deliver a control signal to a control terminal (e.g., a gate terminal) of the switch. The input voltage signal may cause a voltage drop of $V_{FE}$ across the input FE capacitor 102.

The techniques of FIG. 16 include causing nucleation of a DW in FM channel 106 that is electrically connected to a second node of input FE capacitor 102 (1602). The input voltage signal may cause the magnetization state of the PMA-FM channel 106 to change. The change may occur at the end of FM channel 106 that is adjacent to input FE capacitor 102. The boundary between magnetization states within FM channel 106 may be called a DW. The DW may nucleate when the magnetization state of the FM material in PMA-FM channel 106 changes at least at the end that is adjacent to input FE capacitor 102. The electronic device may include IMA-FM material 108 positioned between input FE capacitor 102 and FM channel 106. IMA-FM material 108 may facilitate or speed up the formation of the DW in FM channel 106.

The techniques of FIG. 16 include delivering a propagation voltage signal to a layer of HRM 110 positioned adjacent FM channel 106 (1604). The control circuitry may cause a second power supply circuitry to deliver the propagation voltage signal by at least closing switch 120 (e.g., $T_{PROP}$) between the second power supply circuitry and the HRM 110. The switch may be positioned adjacent to the end of the HRM that is proximate output FE capacitor 104. By closing switch 120, the control circuitry may cause an electrical current (e.g., $J_c$, $I_c$) to flow through the HRM 110 because of the voltage drop across HRM 110 (e.g., from $V_{DD}$ to GND). The control circuitry may be configured to control switch 120 by at least delivering a control signal to the gate or control terminal of switch 120.

The techniques of FIG. 16 include causing the DW to propagate through FM channel 106 in response to delivering the propagation voltage signal to the layer of HRM 110 (1606). The electrical current may facilitate the movement of the DW through FM channel 106 from the end proximate input FE capacitor 102 to the end proximate output FE capacitor 104. When the DW reaches the portion of FM channel 106 that is proximate output FE capacitor 104, the DW may induce a voltage drop across output FE capacitor 104. The voltage drop across output FE capacitor 104 may cause the electronic device to generate an output voltage signal (i.e., $V_{OUT}$).

The control circuitry may be further configured to cause output FE capacitor 104 to generate an output voltage signal in response to causing the DW to propagate through FM channel 106. When the DW propagates through FM channel 106, a change in magnetization state beneath output FE capacitor 104 may cause a voltage difference across output FE capacitor 104. The control circuitry may be configured to deliver the output voltage signal from output FE capacitor 104 to an input FE capacitor of a second electronic device. The control circuitry may be configured to control a transistor-based drive circuit to cause the transistor-based drive circuit to deliver the output signal to the next electronic device (see, e.g., FIG. 4A). Output FE capacitor 104 may deliver the output voltage signal to the control terminals of the transistor-based drive circuit to cause the transistor-based drive circuit to deliver an inverted form of the output voltage signal to the next electronic device as a second input voltage signal.

Figure 17:
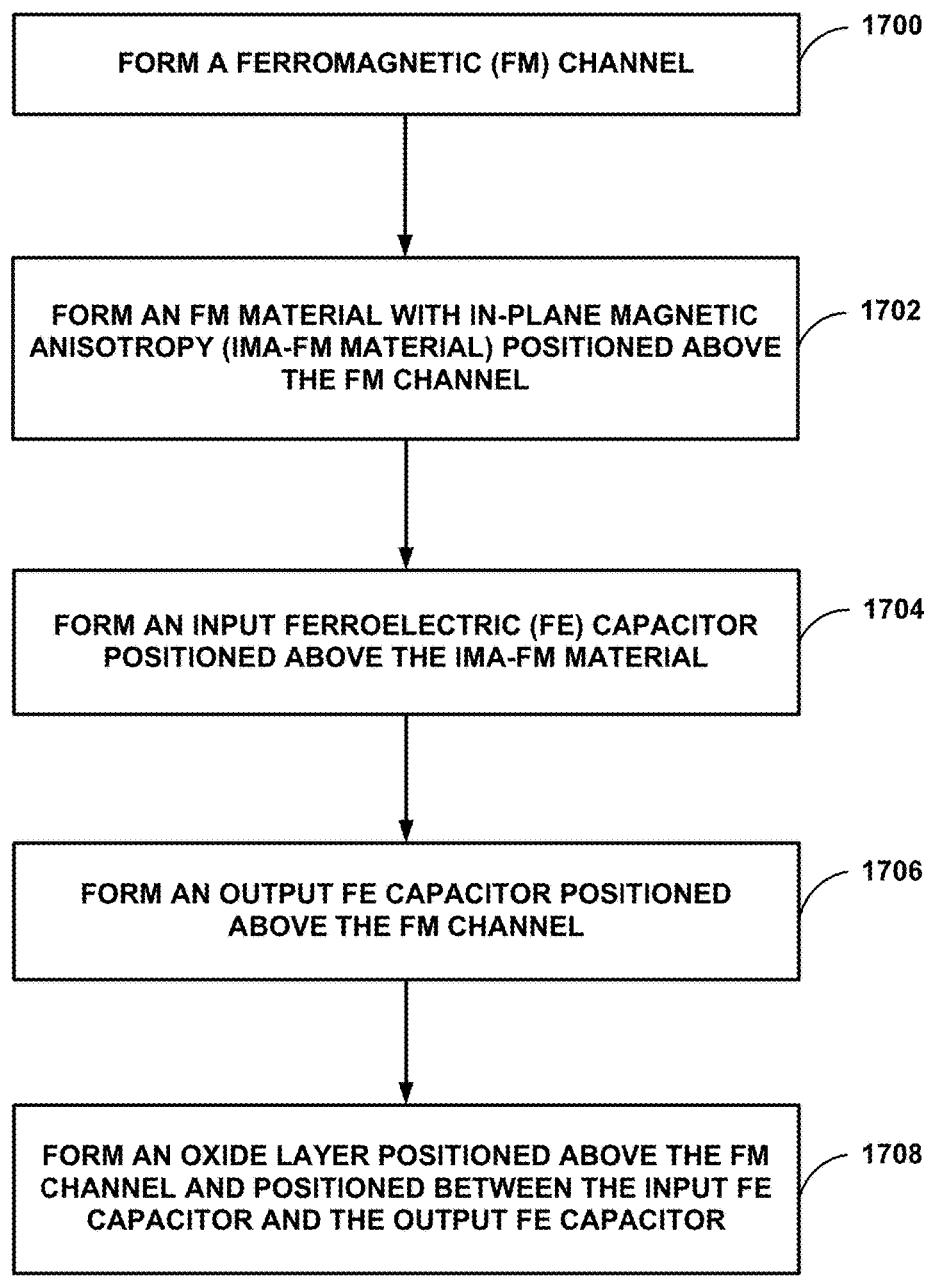
FIG. 17 is a flowchart illustrating example techniques for manufacturing an electronic device, in accordance with some examples of this disclosure.

FIG. 17 is a flowchart illustrating example techniques for manufacturing an electronic device, in accordance with some examples of this disclosure. The techniques of FIG. 17 are described with reference to the electronic device in FIG. 1, although other components, such as the electronic devices of FIGS. 2A-4A, 5A, 5B, 5D, 6, 14, and 15 may exemplify similar techniques.

The techniques of FIG. 17 include forming FM channel 106 (1700). FM channel 106 may include PMA-FM material configured to carry a magnetization signal. The techniques of FIG. 17 further include forming an FM material with in-plane magnetic anisotropy (IMA-FM material) 108 positioned above the FM channel (1702).

The techniques of FIG. 17 further include forming input FE capacitor 102 positioned above IMA-FM channel 108 (1704). Input FE capacitor 102 may include a material such as BFO and may be oriented vertically. The input node of input FE capacitor 102 may be configured to receive an input voltage signal (i.e., $V_{FE}$).

The techniques of FIG. 17 include forming output FE capacitor 104 positioned above FM channel 106 (1706). The output node of output FE capacitor 104 may be electrically connected to a transistor-based drive circuit. The techniques of FIG. 17 also include forming oxide layer 112 positioned above FM channel 106 and positioned between input FE capacitor 102 and output FE capacitor 104 (1708). In some examples, FM channel 106 may have a property of a magnetization state of FM channel 106 changing in response to a voltage applied across input FE capacitor 102, and having a property of causing a voltage change at output FE capacitor 104 based on changing of the magnetization state.

A magnetization state of FM channel 106 is configured to change in response to a voltage applied across input FE capacitor 102, and wherein a change in the magnetization state of FM channel 106 causes a voltage change at output FE capacitor 104. In addition, oxide layer 112 may be formed above FM channel 106 and between FE capacitors 102 and 104. In some examples, the techniques of FIG. 17 may also include forming a layer of HRM 110 positioned beneath FM channel 106. The HRM may include platinum, a platinum alloy, a platinum multilayer, tungsten, a tungsten alloy, a tungsten multilayer, tantalum, a tantalum alloy, a tantalum multilayer, or a topological insulator. In some examples, the techniques of FIG. 17 may also include electrically connecting an output node of the output FE capacitor to a transistor-based drive circuit, such as an inverter circuit.

Various examples have been described. Further examples are described in the Appendix of slides, which is incorporated herein within this disclosure. These and other examples are within the scope of the following claims.

What is claimed is:

1. An electronic device comprising:
    an input ferroelectric (FE) capacitor including a first dielectric layer;
    an output FE capacitor including a second dielectric layer;
    a channel positioned beneath the first dielectric layer of the input FE capacitor and positioned beneath the second dielectric layer of the output FE capacitor, wherein the channel forms at least part of a lower terminal of the input FE capacitor, wherein the channel forms at least part of a lower terminal of the output FE capacitor, and wherein the channel is configured to carry a magnetic signal from the input FE capacitor to the output FE capacitor to cause a voltage change at the output FE capacitor;
    a transistor-based drive circuit electrically connected to an output node at an upper terminal of the output FE capacitor, wherein the transistor-based drive circuit is configured to deliver, based on the voltage change at the output FE capacitor, an output signal to an input node of a second device;
    a layer of high-resistivity material (HRM) positioned beneath the channel; and
    a switch electrically connected to the layer of HRM proximate the output FE capacitor or proximate the input FE capacitor, wherein the layer of HRM is configured to carry an electrical current when the switch is closed, and wherein the electrical current is configured to facilitate the channel to carry the magnetic signal.

2. The electronic device of claim 1, wherein the transistor-based drive circuit comprises an inverter circuit, wherein the inverter circuit is configured to deliver the output signal to the input node of the second device by at least delivering an inverted form of the voltage change at the output FE capacitor to the input node of the second device.

3. The electronic device of claim 2, wherein the inverter circuit comprises a high-side transistor and a low-side transistor, wherein a gate terminal of the high-side transistor is electrically connected to the output node of the output FE capacitor, wherein a gate terminal of the low-side transistor is electrically connected to the output node of the output FE capacitor, and wherein a drain terminal of the high-side transistor and a drain terminal of the low-side transistor are electrically connected to the input node of the second device.

4. The electronic device of claim 1, wherein the channel comprises a ferromagnetic (FM) channel, the electronic device further comprising:
an FM layer including an FM material with in-plane magnetic anisotropy (IMA-FM material), wherein the FM layer is positioned between the first dielectric layer of the input FE capacitor and the FM channel, and wherein the FM layer forms at least part of the lower terminal of the input FE capacitor; and
an exchange-coupling control interlayer positioned between the FM layer and the FM channel.

5. The electronic device of claim 1, further comprising a reset circuit electrically connected to the output node of the output FE capacitor, wherein the reset circuit is configured to reset the voltage change at the output FE capacitor to a default state.

6. The electronic device of claim 1, wherein the input FE capacitor is a first input FE capacitor, the electronic device further comprising at least three input FE capacitors,
wherein the at least three input FE capacitors include the first input FE capacitor,
wherein respective dielectric layers of each input FE capacitor of the at least three input FE capacitors is positioned above the channel,
wherein the channel forms at least part of respective lower terminals of each input FE capacitor of the at least three input FE capacitors, and
wherein the magnetization state of the channel is configured to change in response to voltage applied across a majority of the at least three input FE capacitors.

7. The electronic device of claim 1, wherein the input node of the second device comprises an input node of an input FE capacitor of a second electronic device or an input node of a transistor-based device.

8. An electronic device comprising:
an input ferroelectric (FE) capacitor including a first dielectric layer;
an output FE capacitor including a second dielectric layer;
a ferromagnetic (FM) channel positioned beneath the first dielectric layer of the input FE capacitor and positioned beneath the second dielectric layer of the output FE capacitor, wherein the FM channel forms at least part of a lower terminal of the input FE capacitor, wherein the FM channel forms at least part of a lower terminal of the output FE capacitor, wherein a magnetization state of the FM channel is configured to change in response to a voltage applied across the input FE capacitor, and wherein a change in the magnetization state of the FM channel causes a voltage change at the output FE capacitor; and
an FM layer including an FM material with in-plane magnetic anisotropy (IMA-FM material), wherein the FM layer is positioned between the first dielectric layer of the input FE capacitor and the FM channel, and wherein the FM layer forms at least part of the lower terminal of the input FE capacitor.

9. The electronic device of claim 8, wherein the FM channel comprises an FM material with perpendicular magnetic anisotropy (PMA-FM material), and wherein the input FE capacitor is configured to induce, through the FM layer, the change in the magnetization state in the FM channel in response to the voltage applied across the input FE capacitor.

10. The electronic device of claim 8, further comprising an oxide layer positioned above the FM channel and positioned between the input FE capacitor and the output FE capacitor.

11. The electronic device of claim 8, further comprising:
a layer of high-resistivity material (HRM) positioned beneath the FM channel; and
a switch electrically connected to the layer of HRM proximate the output FE capacitor or proximate the input FE capacitor, wherein the layer of HRM is configured to carry an electrical current when the switch is closed, and wherein the electrical current is configured to facilitate the change in the magnetization state of the FM channel.

12. The electronic device of claim 11, wherein the layer of HRM comprises platinum, a platinum alloy, a platinum multilayer, tungsten, a tungsten alloy, a tungsten multilayer, tantalum, a tantalum alloy, a tantalum multilayer, or a topological insulator.

13. The electronic device of claim 8, further comprising a transistor-based drive circuit electrically connected to an output node at an upper terminal of the output FE capacitor, wherein the transistor-based drive circuit is configured to deliver an output signal to an input FE capacitor of a second electronic device based on the voltage change at the output FE capacitor.

14. The electronic device of claim 13, wherein the transistor-based drive circuit comprises an inverter circuit, wherein the inverter circuit is configured to deliver the output signal to the input FE capacitor of the second electronic device by at least delivering an inverted form of the voltage change at the output FE capacitor to the input FE capacitor of the second electronic device.

15. The electronic device of claim 8, wherein the input FE capacitor is a first input FE capacitor, the electronic device further comprising at least three input FE capacitors,
wherein the at least three input FE capacitors include the first input FE capacitor,
wherein respective dielectric layers of each input FE capacitor of the at least three input FE capacitors are positioned above the FM channel,
wherein the FM channel forms at least part of respective lower terminals of each input FE capacitor of the at least three input FE capacitors, and
wherein the magnetization state of the FM channel is configured to change in response to voltage applied across a majority of the at least three input FE capacitors.

16. The electronic device of claim 15, further comprising at least three FM layers including IMA-FM material,
wherein each FM layer of the at least three FM layers is positioned between the FM channel and the respective dielectric layers of a respective input FE capacitor of the at least three input FE capacitors, and
wherein each FM layer of the at least three FM layers forms at least part of the respective lower terminals of each input FE capacitor of the at least three input FE capacitors.

17. An electronic device comprising:
an input ferroelectric (FE) capacitor including a first dielectric layer;
an output FE capacitor including a second dielectric layer;
a ferromagnetic (FM) channel positioned beneath the first dielectric layer of the input FE capacitor and positioned beneath the second dielectric layer of the output FE capacitor, wherein the FM channel forms at least part of a lower terminal of the input FE capacitor, wherein the FM channel forms at least part of a lower terminal of the output FE capacitor, wherein a magnetization state of the FM channel is configured to change in response to a voltage applied across the input FE capacitor, and wherein a change in the magnetization state of the FM channel causes a voltage change at the output FE capacitor;

a layer of high-resistivity material (HRM) positioned beneath the FM channel; and a switch electrically connected to the layer of HRM proximate the output FE capacitor or proximate the input FE capacitor, wherein the layer of HRM is configured to carry an electrical current when the switch is closed, and wherein the electrical current is configured to facilitate the change in the magnetization state of the FM channel.

18. The electronic device of claim 17, wherein the layer of HRM comprises platinum, a platinum alloy, a platinum multilayer, tungsten, a tungsten alloy, a tungsten multilayer, tantalum, a tantalum alloy, a tantalum multilayer, or a topological insulator.

19. The electronic device of claim 17, wherein the input FE capacitor is a first input FE capacitor, the electronic device further comprising at least three input FE capacitors, wherein the at least three input FE capacitors include the first input FE capacitor, wherein respective dielectric layers of each input FE capacitor of the at least three input FE capacitors is positioned above the FM channel, wherein the FM channel forms at least part of respective lower terminals of each input FE capacitor of the at least three input FE capacitors, and wherein the magnetization state of the FM channel is configured to change in response to voltage applied across a majority of the at least three input FE capacitors.

20. An electronic device comprising:

a ferromagnetic (FM) channel including an FM material with perpendicular magnetic anisotropy (PMA-FM material);

an FM layer including an FM material with in-plane magnetic anisotropy (IMA-FM material) positioned above the FM channel;

an input ferroelectric (FE) capacitor including a first dielectric layer, wherein the FM layer is positioned between the first dielectric layer of the input FE capacitor and the FM channel, and wherein the FM channel forms at least part of a lower terminal of the input FE capacitor; and an output FE capacitor including a second dielectric layer positioned above the FM channel, and wherein the FM channel forms at least part of a lower terminal of the output FE capacitor.

* * * * *